United States Patent
Choi et al.

(10) Patent No.: US 10,622,265 B2
(45) Date of Patent: Apr. 14, 2020

(54) METHOD OF DETECTING FAILURE OF A SEMICONDUCTOR DEVICE

(71) Applicant: SAMSUNG ELECTRONICS CO., LTD., Suwon-si, Gyeonggi-do (KR)

(72) Inventors: Ji-Young Choi, Seoul (KR); Zhan Zhan, Suwon-si (KR); Min-Seob Kim, Hwaseong-si (KR); Ju-Hyun Kim, Suwon-si (KR); Sung-Gun Kang, Suwon-si (KR); Hwa-Sung Rhee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/245,686

(22) Filed: Jan. 11, 2019

(65) Prior Publication Data

US 2019/0385918 A1    Dec. 19, 2019

(30) Foreign Application Priority Data

Jun. 18, 2018 (KR) .................. 10-2018-0069597

(51) Int. Cl.
| | |
|---|---|
| *G01R 31/00* | (2006.01) |
| *H01L 21/66* | (2006.01) |
| *G01R 31/26* | (2020.01) |

(52) U.S. Cl.
CPC .......... *H01L 22/14* (2013.01); *G01R 31/2644* (2013.01)

(58) Field of Classification Search
None
See application file for complete search history.

(56) References Cited

U.S. PATENT DOCUMENTS

| | | | |
|---|---|---|---|
| 7,851,235 B2 | 12/2010 | Hong | |
| 7,973,309 B2 | 7/2011 | Kim et al. | |
| 2008/0157375 A1 | 7/2008 | Lee | |
| 2008/0157800 A1 | 7/2008 | Hong | |
| 2016/0025805 A1* | 1/2016 | Uppal ................ | G01R 31/2884 324/750.3 |
| 2017/0067955 A1 | 3/2017 | Moll et al. | |
| 2017/0082678 A1* | 3/2017 | Li ...................... | G01R 31/2628 |
| 2017/0307667 A1 | 10/2017 | Liu et al. | |
| 2018/0226339 A1* | 8/2018 | Kim ................... | H01L 23/5223 |
| 2018/0308973 A1* | 10/2018 | Ebiike ................ | H01L 22/12 |

FOREIGN PATENT DOCUMENTS

| | | |
|---|---|---|
| JP | 2010-186775 A | 8/2010 |
| KR | 10-1998-0056119 A | 9/1998 |
| KR | 10-2008-0061003 A | 7/2008 |
| KR | 10-0869746 B1 | 11/2008 |
| KR | 10-2009-0119188 A | 11/2009 |

* cited by examiner

*Primary Examiner* — Evren Seven
(74) *Attorney, Agent, or Firm* — Lee IP Law, PC

(57) ABSTRACT

A method of detecting failure of a semiconductor device includes forming an active fin on an active region of a substrate, the active fin extending in a first direction, forming a gate structure on the active fin, the gate structure extending in a second direction intersecting the first direction, forming source/drain layers on respective portions of the active fins at opposite sides of the gate structure, forming a wiring to be electrically connected to the source/drain layers, and applying a voltage to measure a leakage current between the source/drain layers. Only one or two active fins may be formed on the active region. Only one or two gate structures may be formed on the active fin.

20 Claims, 32 Drawing Sheets

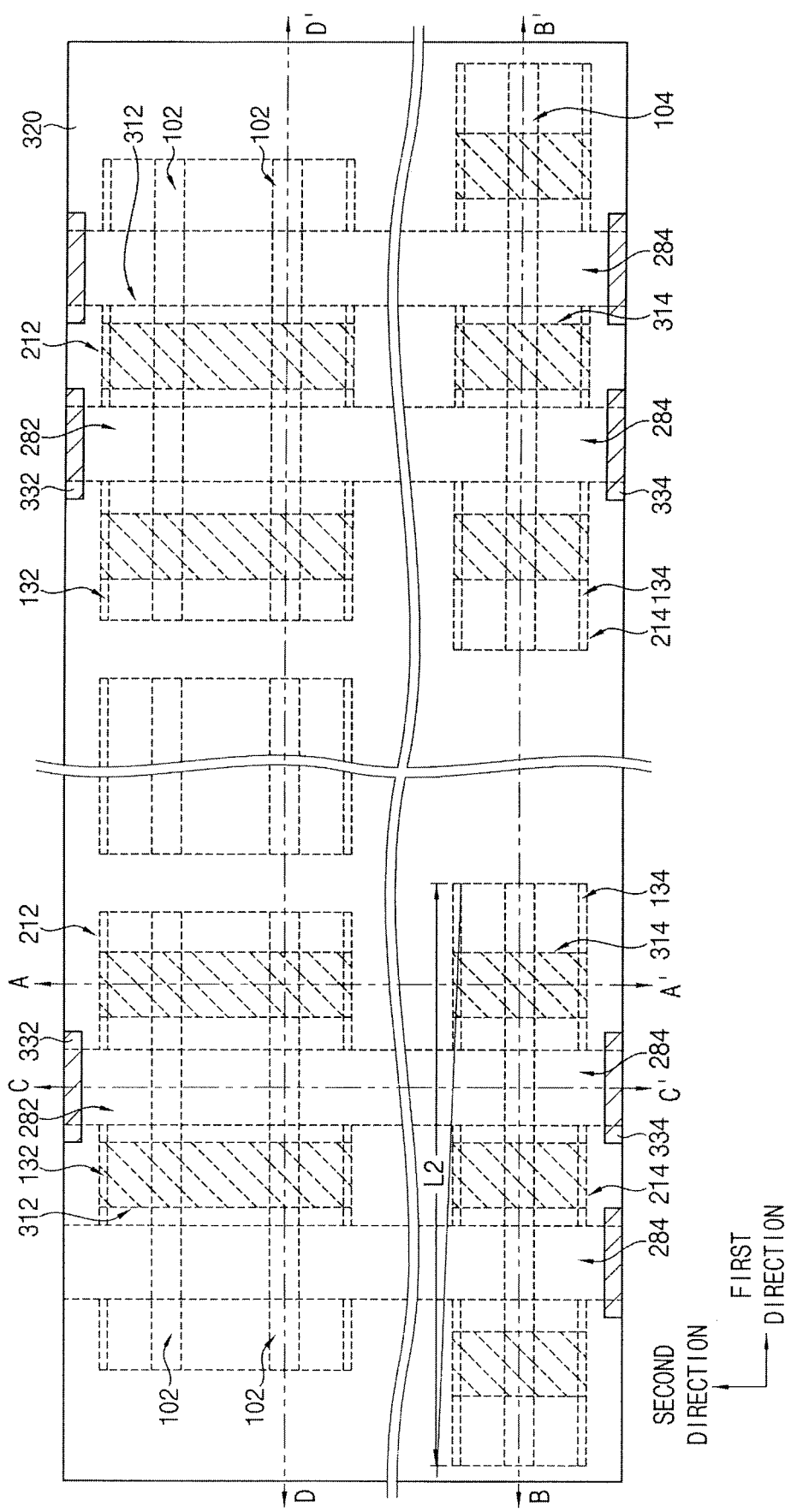

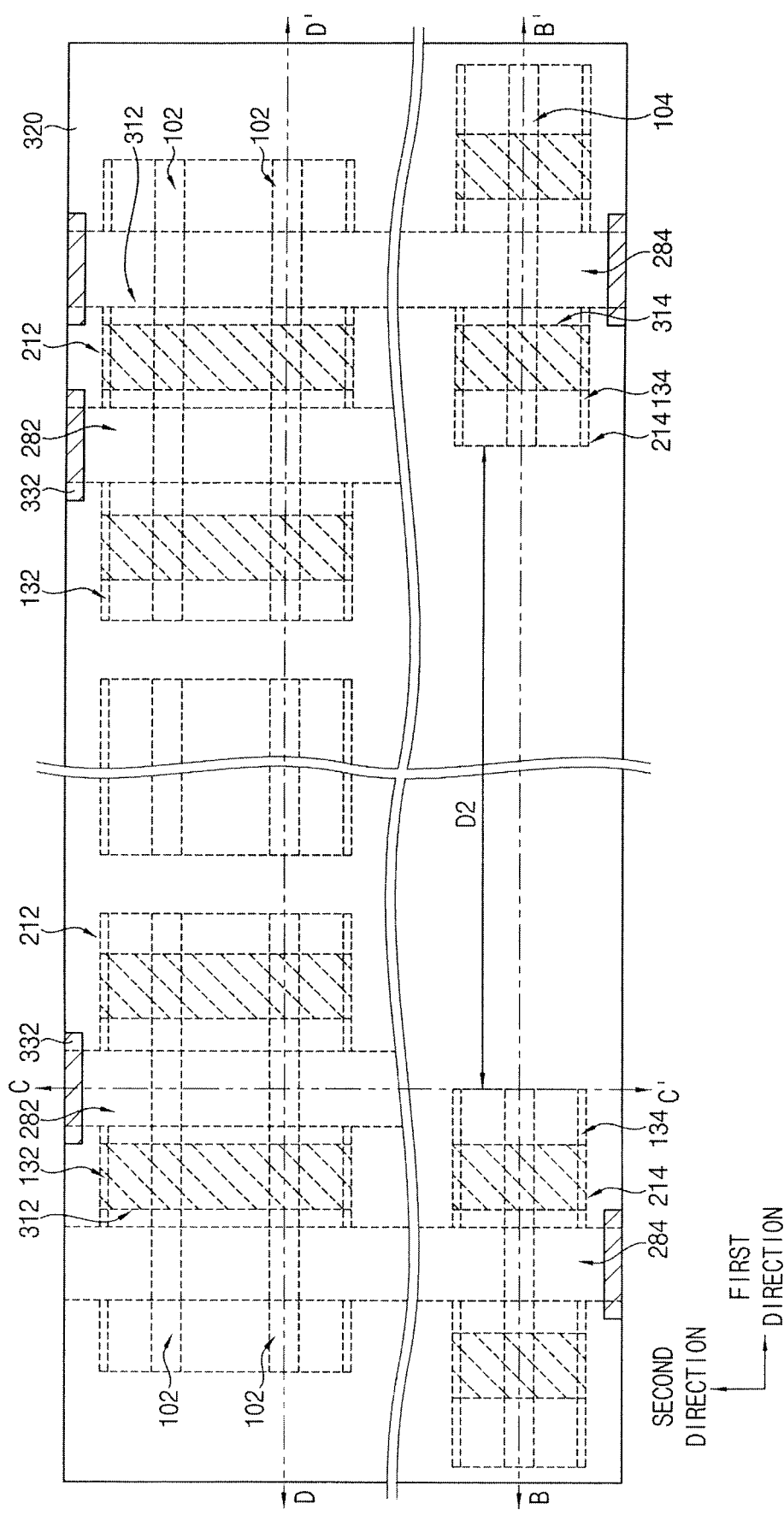

METHOD OF DETECTING FAILURE OF A SEMICONDUCTOR DEVICE

CROSS-REFERENCE TO RELATED APPLICATION

Korean Patent Application No. 10-2018-0069597, filed on Jun. 18, 2018, in the Korean Intellectual Property Office, and entitled: "Method of Detecting Failure of a Semiconductor Device," is incorporated by reference herein in its entirety.

BACKGROUND

1. Field

Embodiments relate to a method of detecting failure of a semiconductor device.

2. Description of the Related Art

Failure of a semiconductor chip may be detected by a test after electrical die sorting (EDS). Such a process, however, may involve an extended feedback time in the course of product development.

SUMMARY

Embodiments are directed to a method of detecting failure of a semiconductor device, the method including forming first and second active fins on first and second regions, respectively, of a substrate, forming first and second gate structures on the first and second active fins, respectively, forming first source/drain layers on respective portions of the first active fin at opposite sides of the first gate structure, and forming second source/drain layers on respective portions of the second active fins at opposite sides of the second gate structure, forming first and second wirings to be electrically connected to the first and second source/drain layers, respectively, and detecting a leakage current between the second source/drain layers by applying a voltage to the second wiring. The first and second active fins may be formed on first and second active regions, respectively, in the first and second regions of the substrate, the first and second active regions having upper surfaces higher than those of other portions in the first and second regions, respectively, of the substrate. Only one or two second active fins may be formed on the second active region.

Embodiments are also directed to a method of detecting failure of a semiconductor device, the method including forming an active fin on an active region of a substrate, the active fin extending in a first direction, forming a gate structure on the active fin, the gate structure extending in a second direction intersecting the first direction, forming source/drain layers on respective portions of the active fins at opposite sides of the gate structure, forming a wiring to be electrically connected to the source/drain layers, and applying a voltage to measure a leakage current between the source/drain layers. Only one or two active fins may be formed on the active region. Only one or two gate structures may be formed on the active fin.

Embodiments are also directed to a method of detecting failure of a semiconductor device, the method including removing an upper portion of a substrate in a second direction to form active fins that extend in a first direction intersecting the second direction, removing one or more of the active fins and a portion of the substrate to form active regions that are spaced apart from each other in the first direction or the second direction, each of the active regions including ones of the active fins thereon, and at least one first active region of the active regions including only one or two active fins thereon, forming a gate structure on the active fins, the gate structure extending in the second direction, forming source/drain layers on respective portions of the active fins at opposite sides of the gate structure, forming wirings to be electrically connected to the source/drain layers, respectively, and applying a voltage to one or ones of the wirings electrically connected to the source/drain layers on the active fins on the at least one first active region to measure a leakage current between the source/drain layers.

BRIEF DESCRIPTION OF THE DRAWINGS

Features will become apparent to those of skill in the art by describing in detail example embodiments with reference to the attached drawings in which:

FIGS. 30 to 32 illustrate plan views of a semiconductor device in accordance with an example embodiment.

DETAILED DESCRIPTION

A method of detecting failure of a semiconductor in accordance with example embodiments will be described more fully hereinafter with reference to the accompanying drawings.

FIGS. 1 to 27 are plan views and cross-sectional views illustrating a method of manufacturing a semiconductor device and a method of detecting failure in accordance with an example embodiment.

Specifically; FIGS. 1, 3, 6, 9, 12, 15 and 19 are plan views, and FIGS. 2, 4 to 5, 7 to 8, 10 to 11, 13 to 14, 16 to 18 and 20 to 27 are cross-sectional views.

Figure 23:
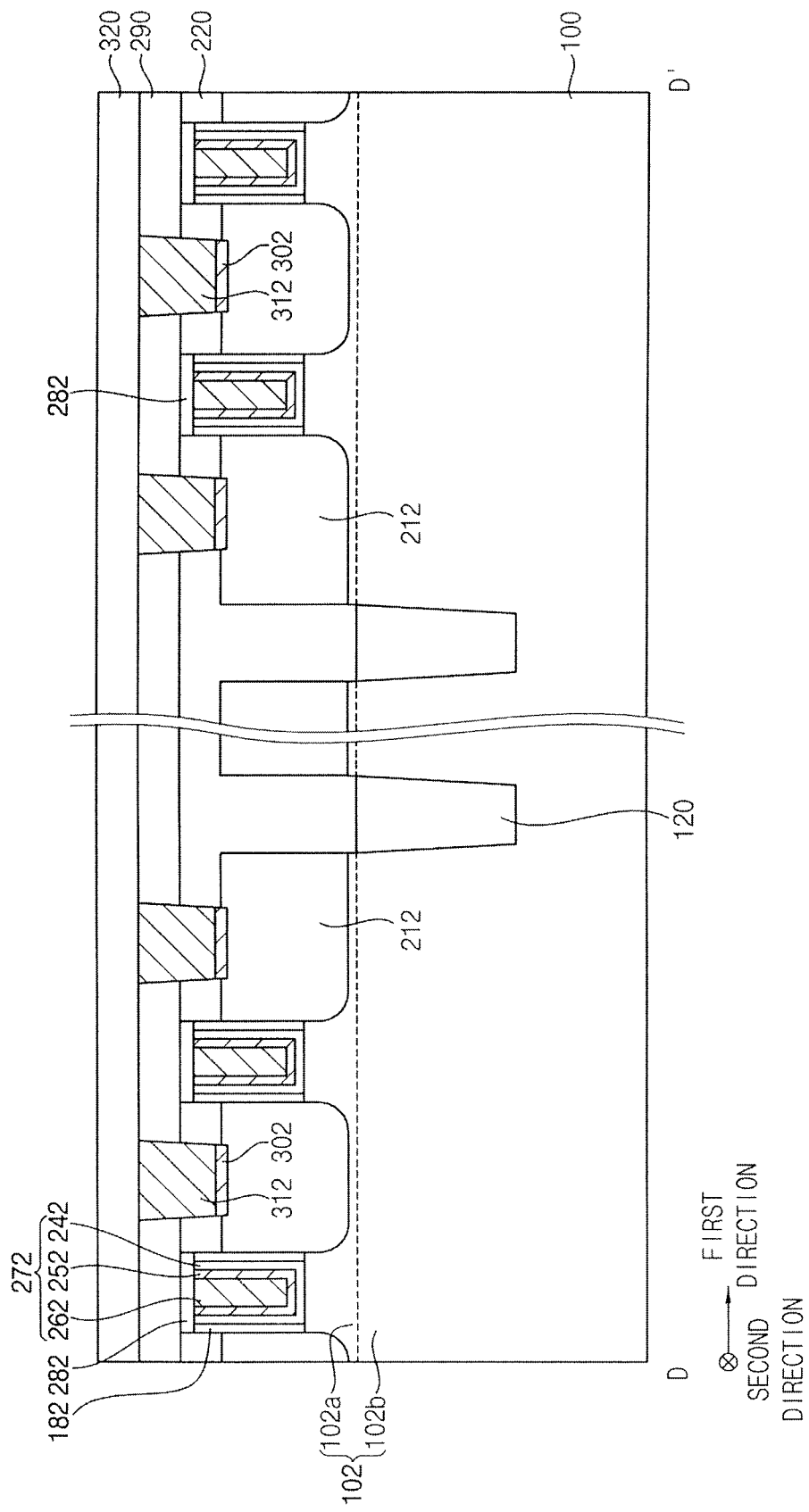
Figure 24:
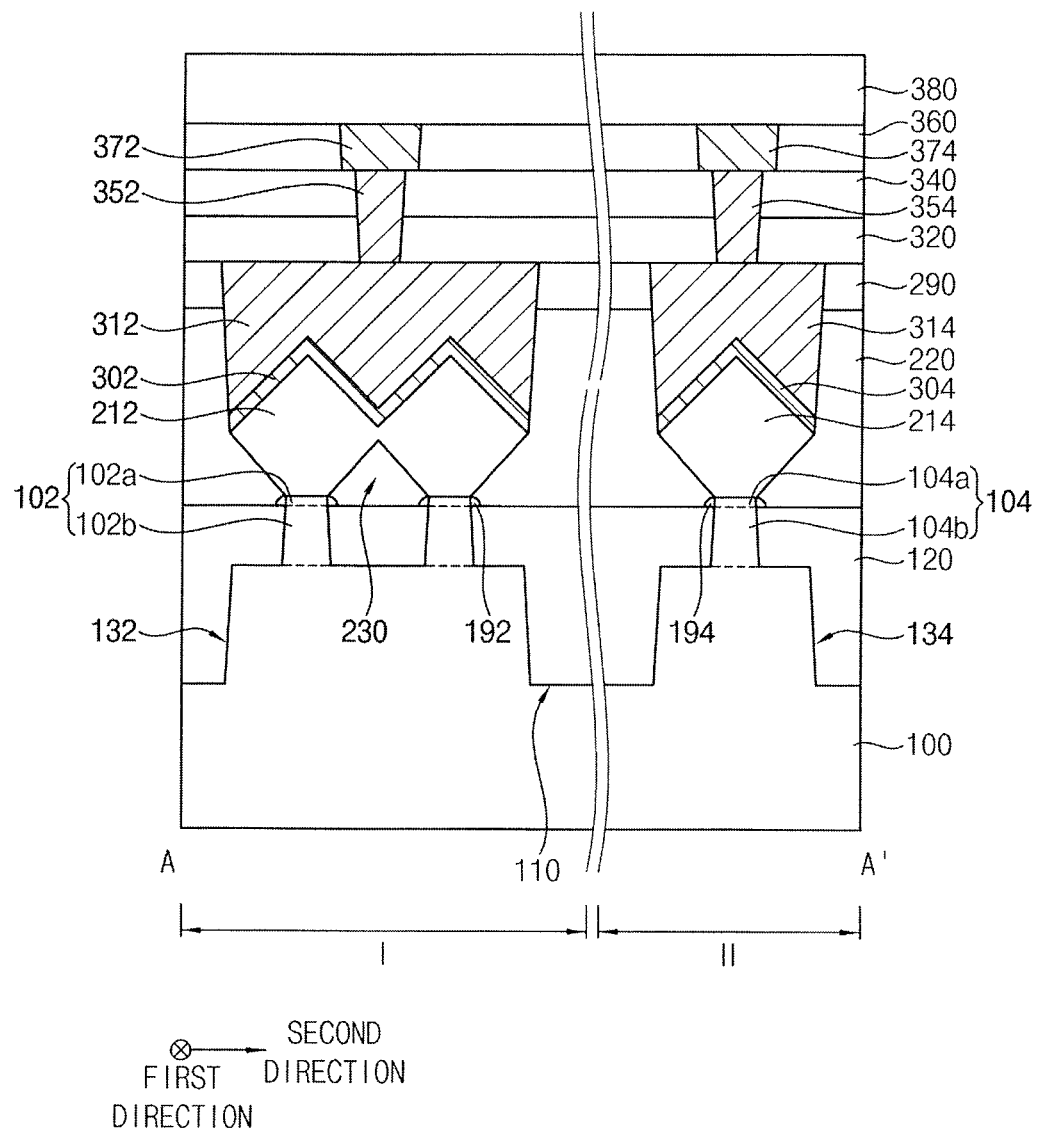
Figure 25:
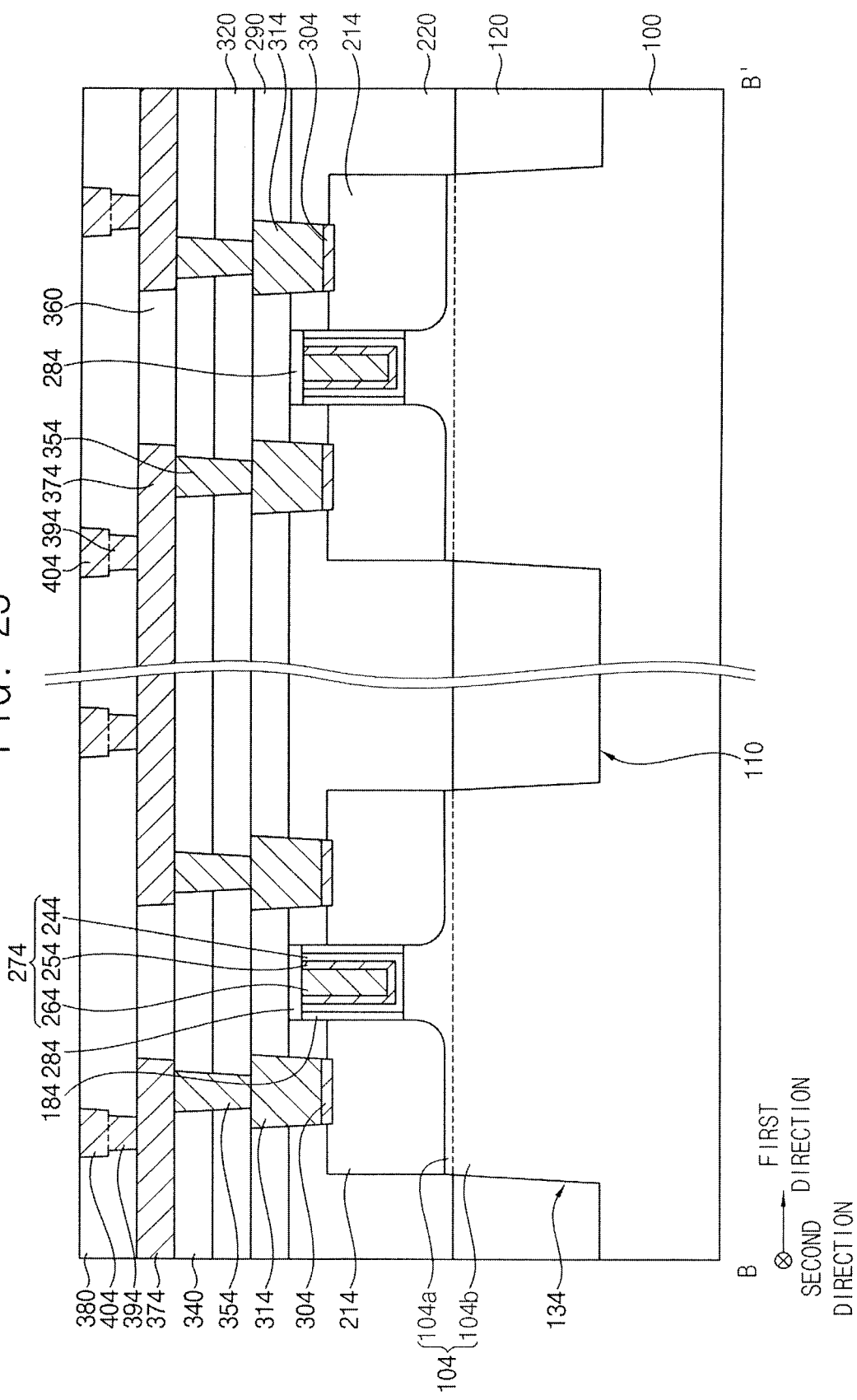
Figure 26:
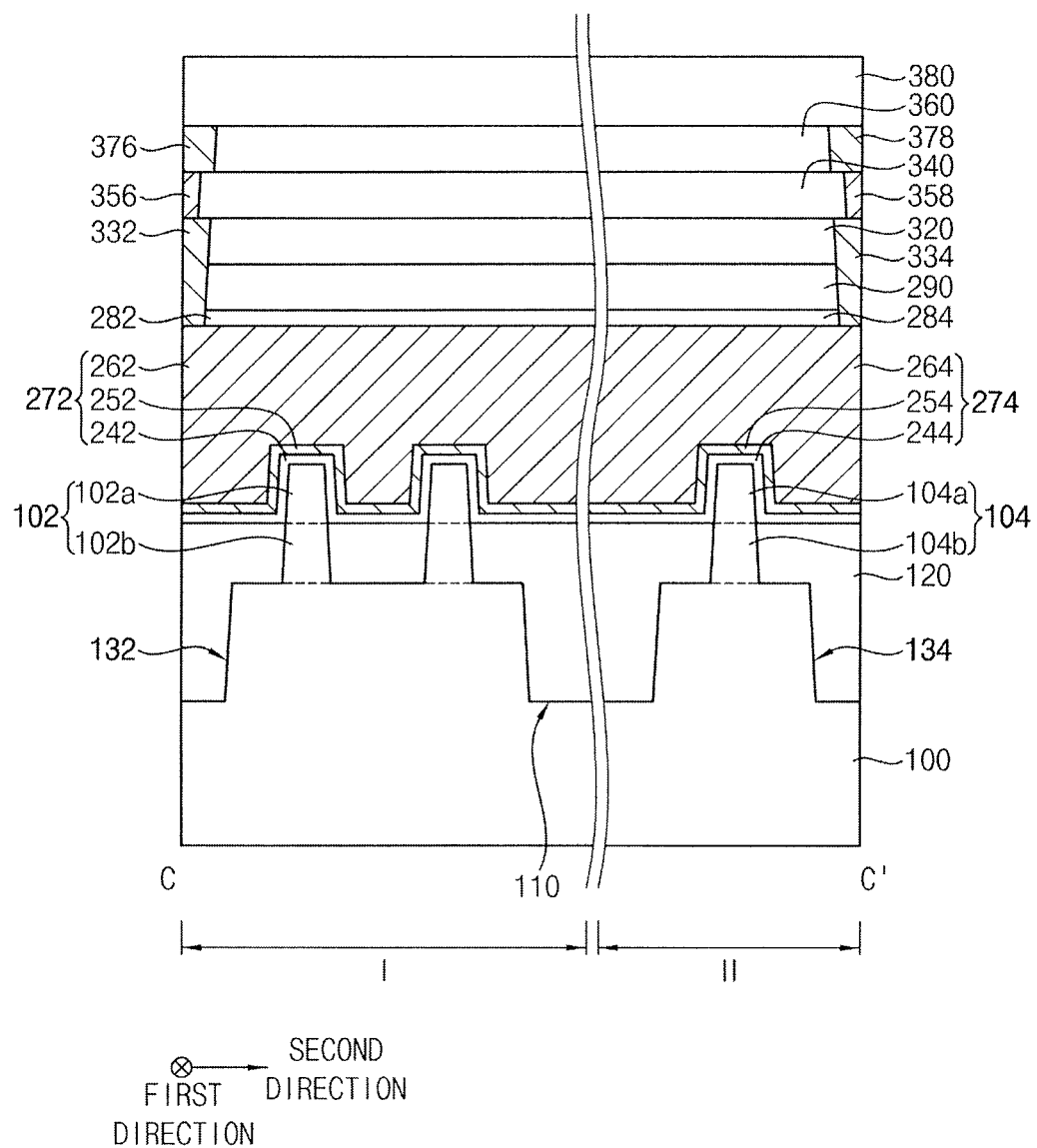
Figure 27:
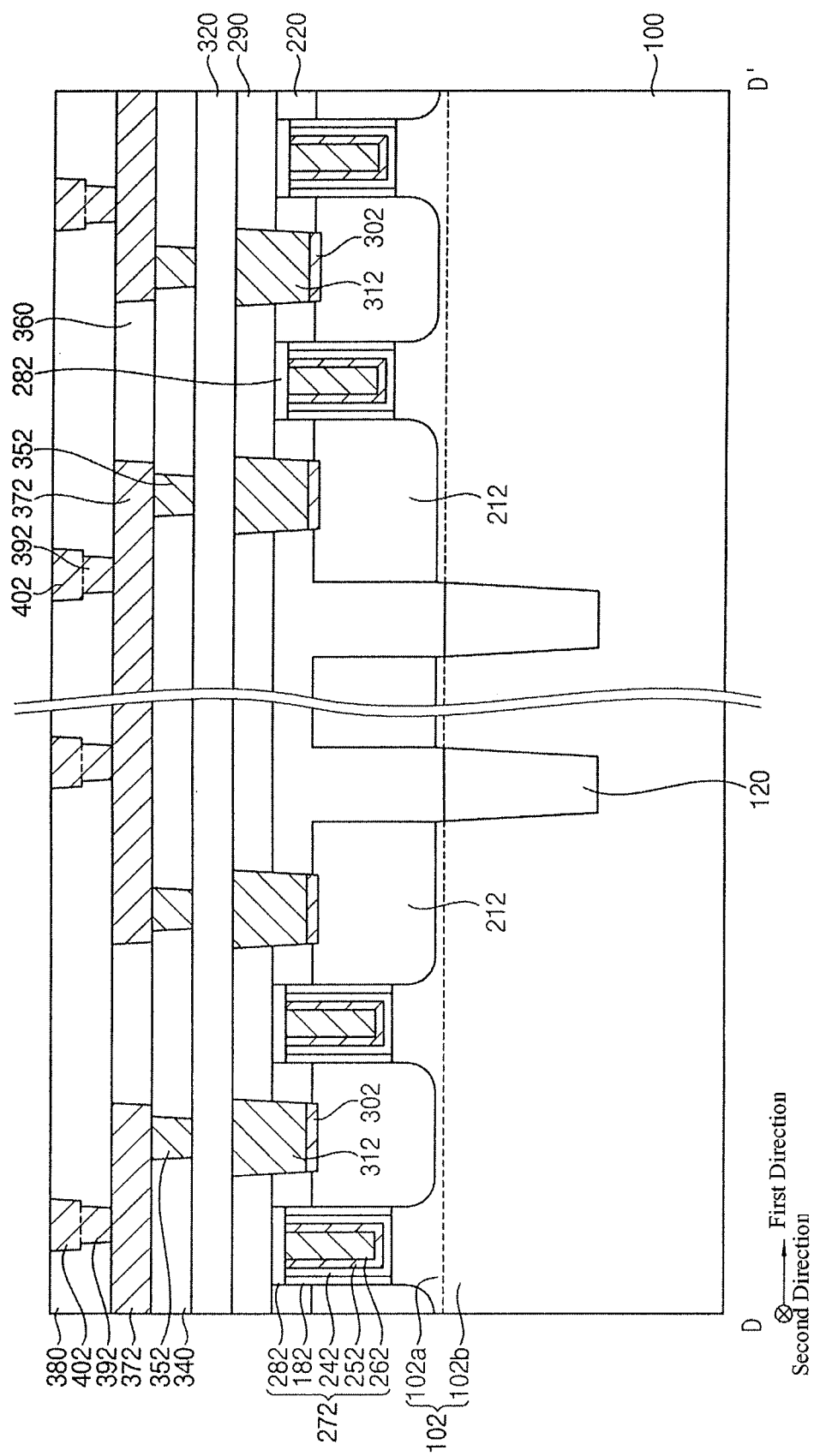

FIGS. 2, 4, 10, 13, 20 and 24 are cross-section views taken along lines A-A' of corresponding plan views, respectively, FIGS. 5, 7, 11, 14, 16, 18, 21 and 25 are cross-sectional views taken along lines B-B' of corresponding plan views, respectively, FIGS. 8, 17, 22 and 26 are cross-sectional views taken along lines C-C' of corresponding plan views, respectively, and FIGS. 23 and 27 are cross-sectional views taken along lines D-D' of corresponding plan views, respectively.

Figure 1:
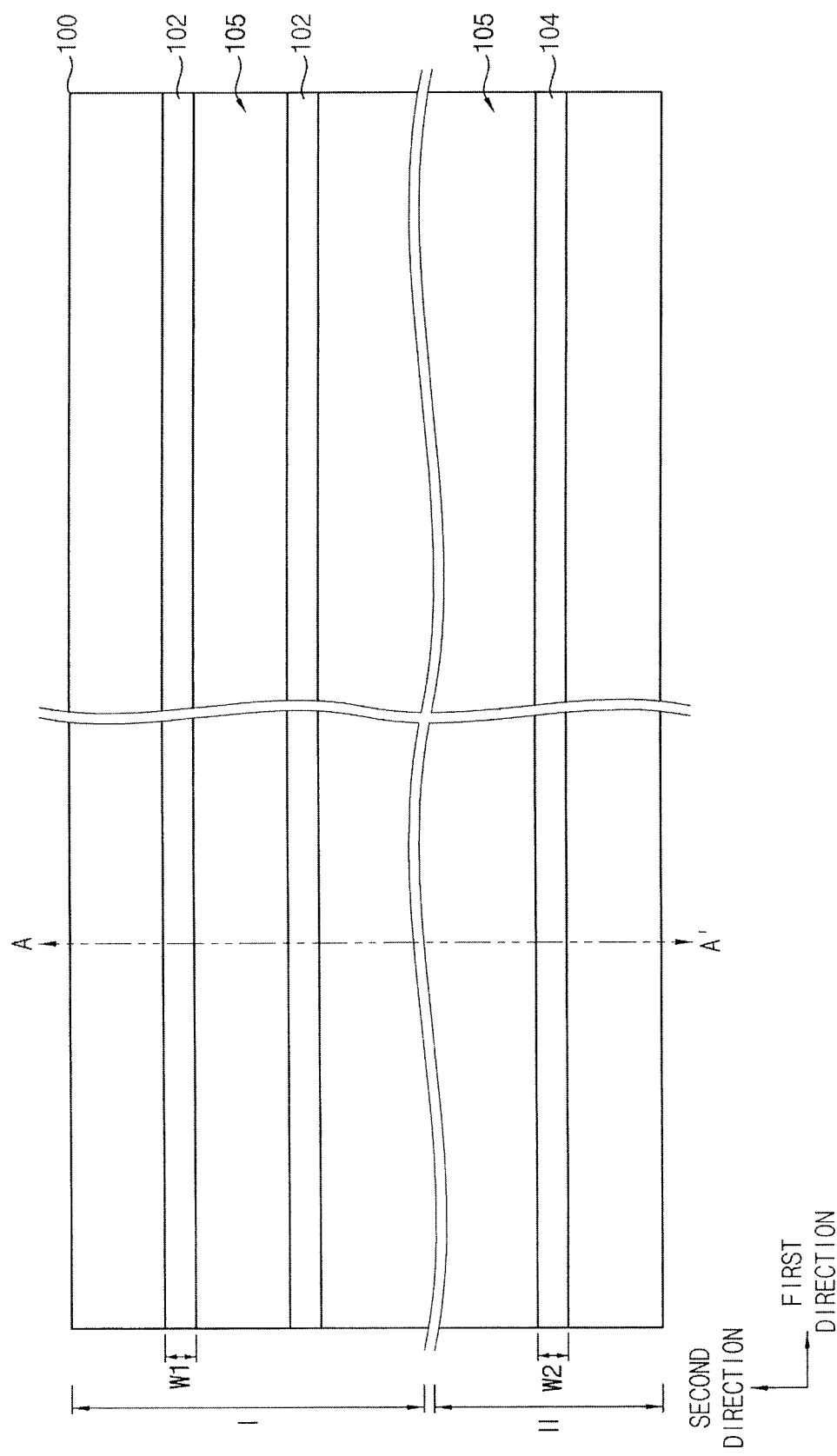
FIGS. 1 to 27 illustrate plan views and cross-sectional views of stages in a method of manufacturing a semiconductor device and a method of detecting failure in accordance with an example embodiment.
Figure 2:
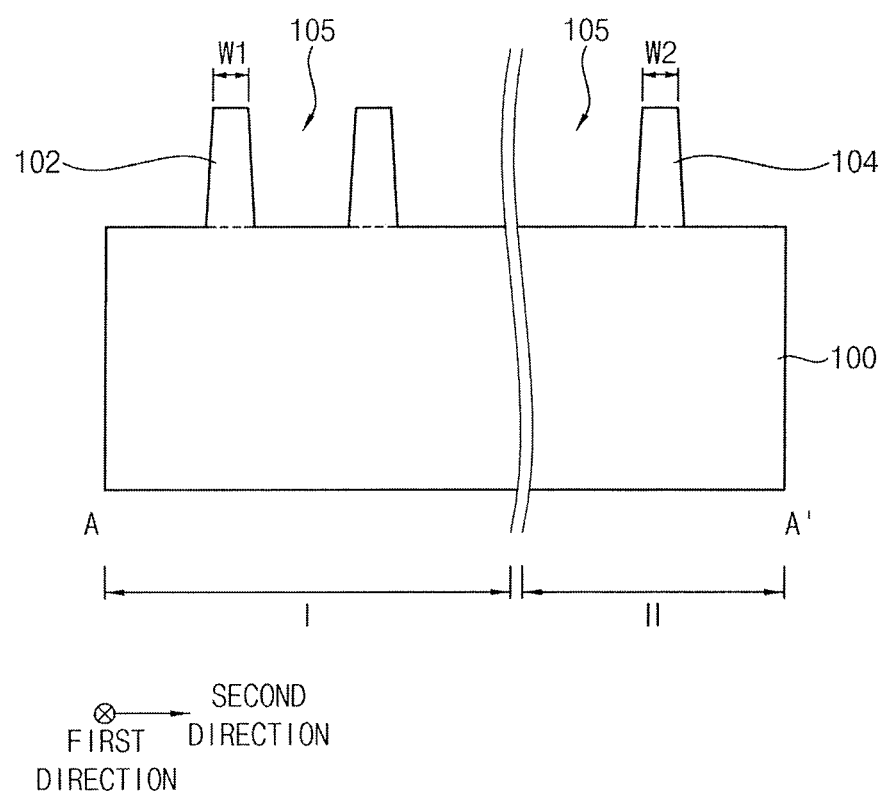

Referring to FIGS. 1 and 2, a substrate 100 may include a first region I and a second region II. The first region I of the substrate 100 may be a chip region on which various elements of the semiconductor device are formed, and the second region II of the substrate 100 may be a scribe lane region that surrounds the chip region and is separated or removed later by a dicing operation.

The substrate 100 may be, e.g., a wafer such as a semiconductor wafer. The substrate 100 may include semiconductor materials e.g., silicon, germanium, silicon-germanium, etc., or III-V compounds e.g., GaP, GaAs, GaSb, etc.

In some embodiments, the substrate 100 may be a silicon-on-insulator (SOI) substrate or a germanium-on-insulator (GOI) substrate.

An upper portion of a substrate 100 including first and second regions I and II may be partially etched to form a first recess 105, and thus first and second active fins 102 and 104 protruding upwardly from remaining portions of the substrate 100 may be formed on the first and second regions I and II, respectively, of the substrate 100.

Each of the first and second active fins 102 and 104 may extend in a first direction substantially parallel to an upper surface of the substrate 100. A plurality of first active fins 102 may be formed in a second direction substantially parallel to the upper surface of the substrate 100 and intersecting the first direction. One or a plurality of second active fins 104 may be formed in the second direction on the second region II of the substrate 100. In an example embodiment, the first and second directions may be orthogonal to each other.

The first and second active fins 102 and 104 may have first and second widths W1 and W2, respectively, in the second direction. In an example embodiment, the first and second widths W1 and W2 may have the same value.

Figure 3:
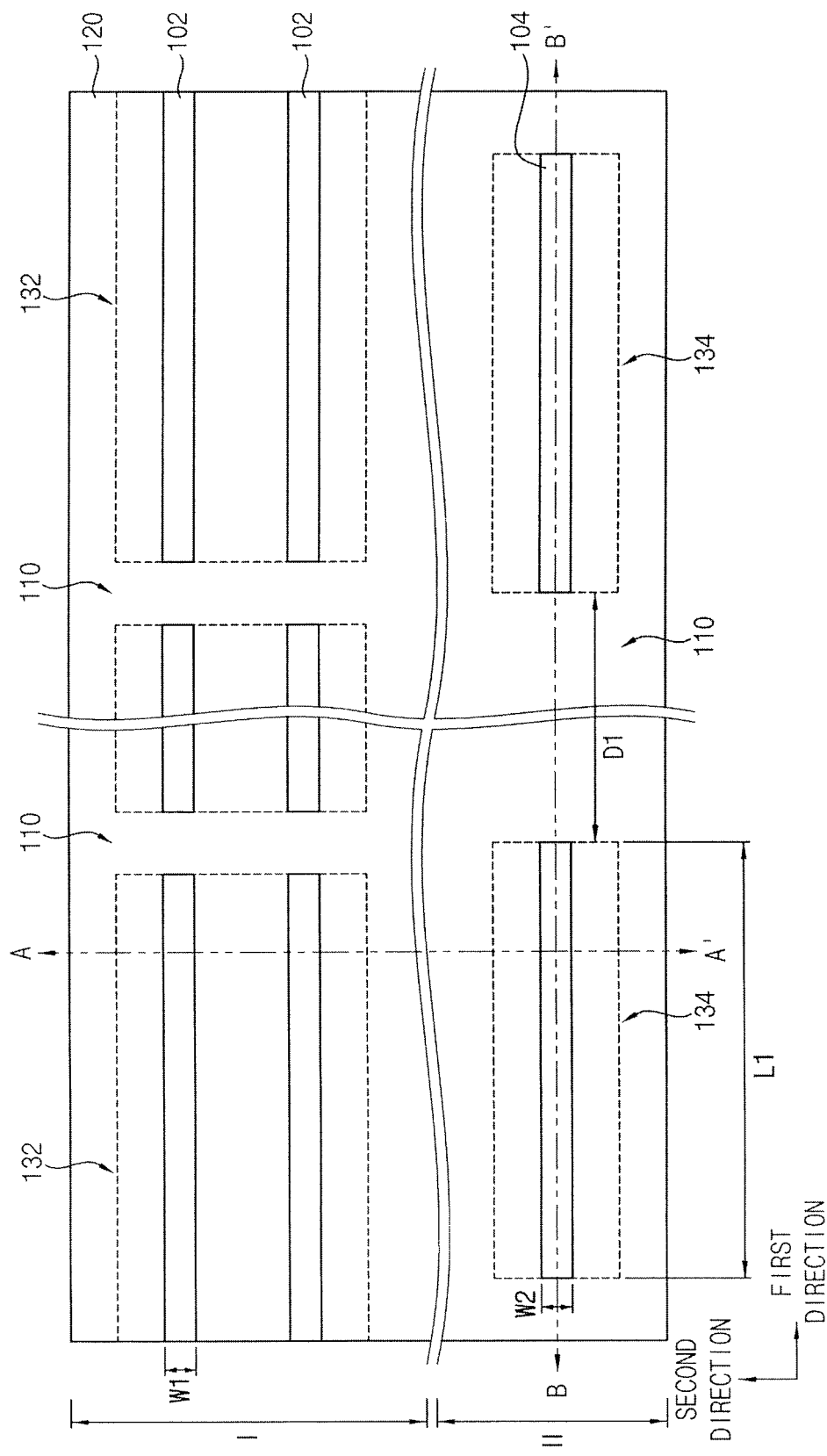
Figure 4:
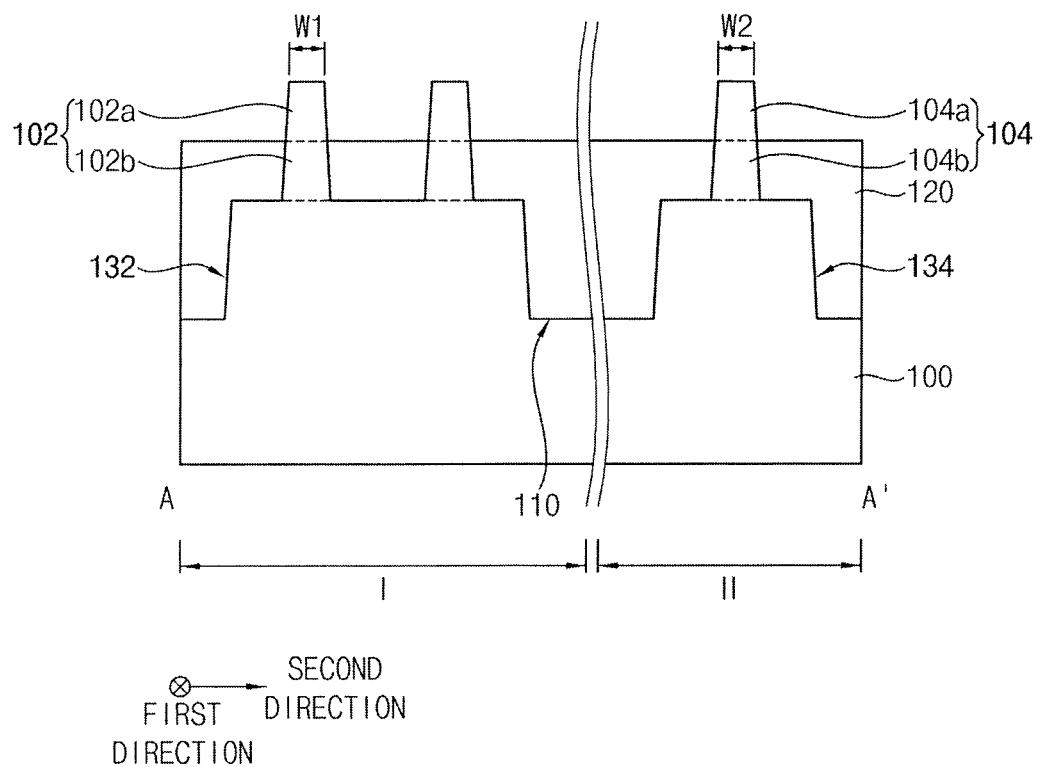
Figure 5:
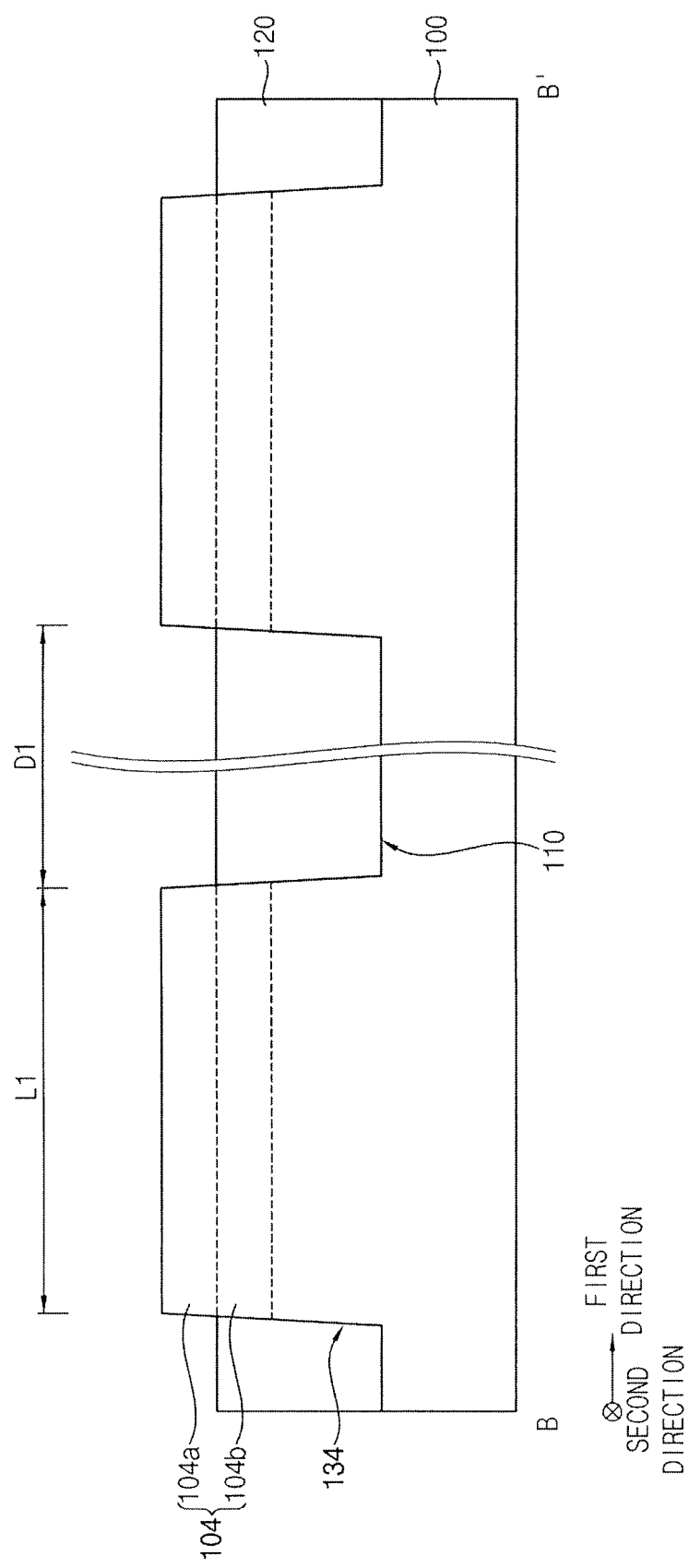

Referring to FIGS. 3 to 5, a first mask (not shown) may be formed to cover the first and second active fins 102 and 104 and a portion of the substrate 100 adjacent thereto, and an etching process using the first mask as an etching mask may be performed to form a second recess 110, which may be deeper than and connected to the first recess 105.

Accordingly, first and second active regions 132 and 134 defined by the second recess 110 may be formed in the first and second regions I and II, respectively, of the substrate 100.

In an example embodiment, a plurality of first active regions 132 may be formed in the first region I of the substrate 100 in the first direction or in the second direction, and a plurality of second active regions 134 may be formed in the second region II of the substrate 100 in the first direction or in the second direction. Each of the first and second active regions 132 and 134 may have an upper surface higher than those of other portions of the substrate 100, and the first and second active fins 102 and 104 may protrude upwardly from upper surfaces of the first and second active regions 132 and 134, respectively.

In an example embodiment, at least one of the second active regions 134 may include only one second active fin 104 thereon. For example, when only one second active fin 104 is formed on the second region II of the substrate 100, the second recess 110 may be formed such that each of the second active regions 134 may include a portion of the one second active fin 104. When a plurality of second active fins 104 is formed on the second region II of the substrate 100, the second recess 110 may be formed such that at least one of the second active regions 134 may include a portion of only one of the second active fins 104.

The at least one of the second active regions 134 including only one second active fin 104 thereon may have a first extension length L1 in the first direction, and thus the only one of the second active fin 104 may also have the first extension length L1 in the first direction. In an example embodiment, the first extension length L1 of the second active fin 104 may have a value equal to or less than about 30 times the second width W2 in the second direction of the second active fin 104.

FIG. 3 illustrates two second active regions 134 each including only one second active fin 104 thereon. The second active regions 134 may be spaced apart from each other by a first distance D1 in the first direction. In an example embodiment, the first distance D1 may have a value equal to or more than about 30 times the second width W2 in the second direction of the second active fin 104.

Although not shown, when the second active regions 134 are formed to be spaced apart from each other in the second direction, a distance between the second active regions 134 may also have a value equal to or more than about 30 times the second width W2 in the second direction of the second active fin 104.

An isolation pattern 120 may be formed to cover the second recess 110 and a lower portion of the first recess 105.

In an example embodiment, the isolation pattern 120 may be formed by forming an isolation layer on the substrate 100 to sufficiently fill the first and second recesses 105 and 110, planarizing the isolation layer until upper surfaces of the first and second active fins 102 and 104 are exposed, and removing an upper portion of the isolation layer until an upper portion of the first recess 105 is exposed. The isolation pattern 120 may include an oxide, e.g., silicon oxide.

In an example embodiment, the first active fin 102 may include a first lower active pattern 102b of which a sidewall is surrounded by the isolation pattern 120 and a first upper active pattern 102a protruding from an upper surface of the isolation pattern 120, and the second active fin 104 may include a second lower active pattern 104b of which a sidewall is surrounded by the isolation pattern 120, and a second upper active pattern 104a protruding from the upper surface of the isolation pattern 120.

Figure 6:
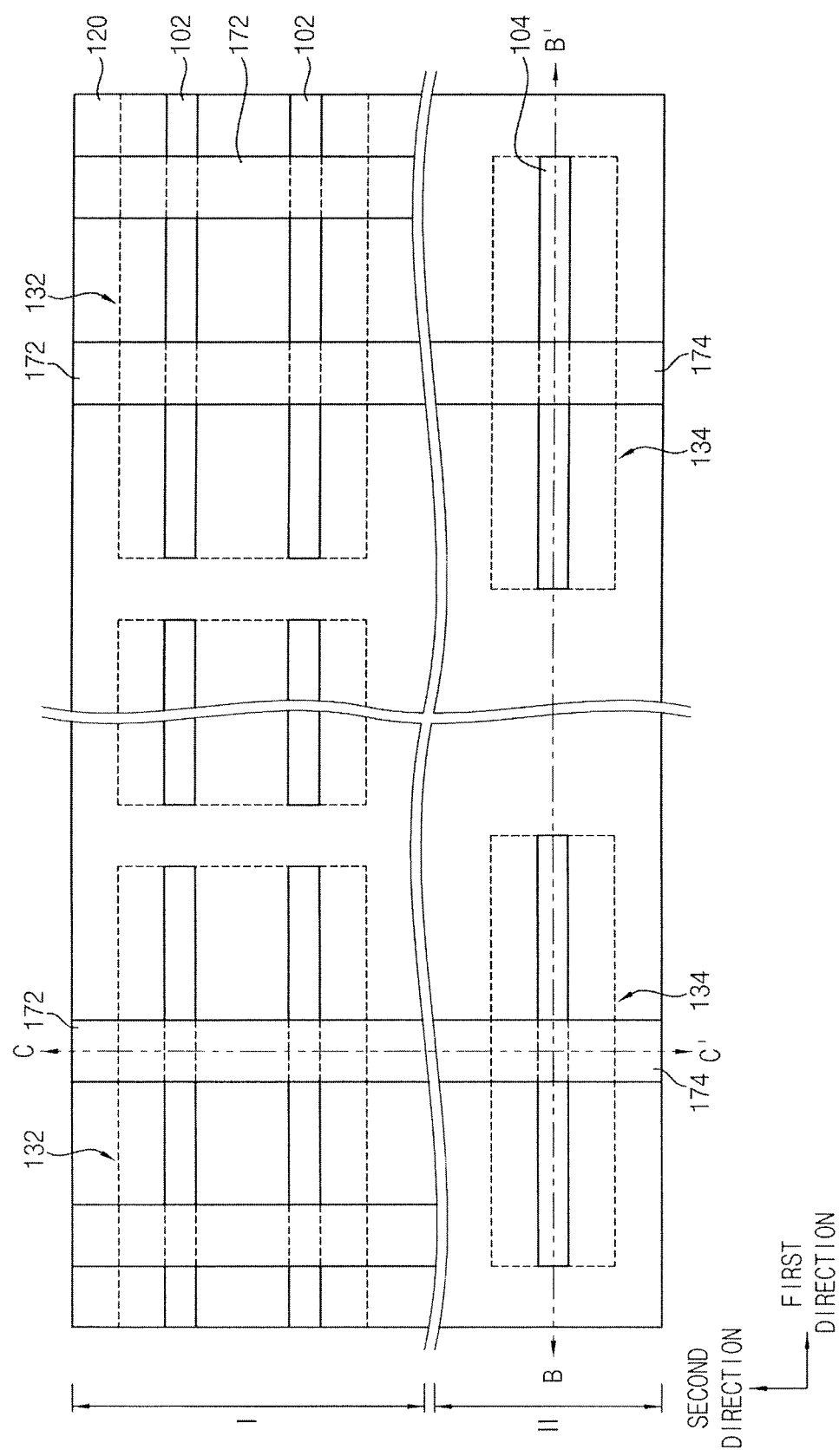
Figure 7:
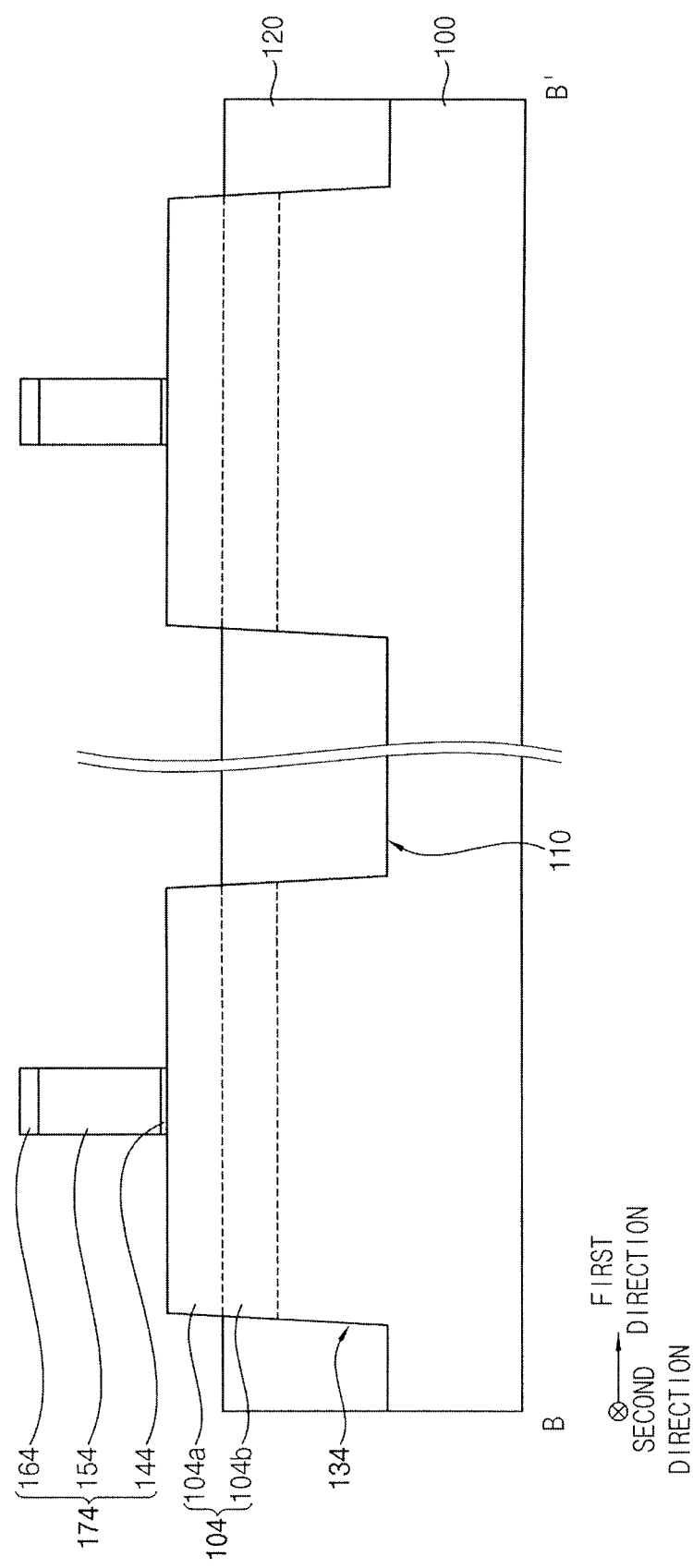
Figure 8:
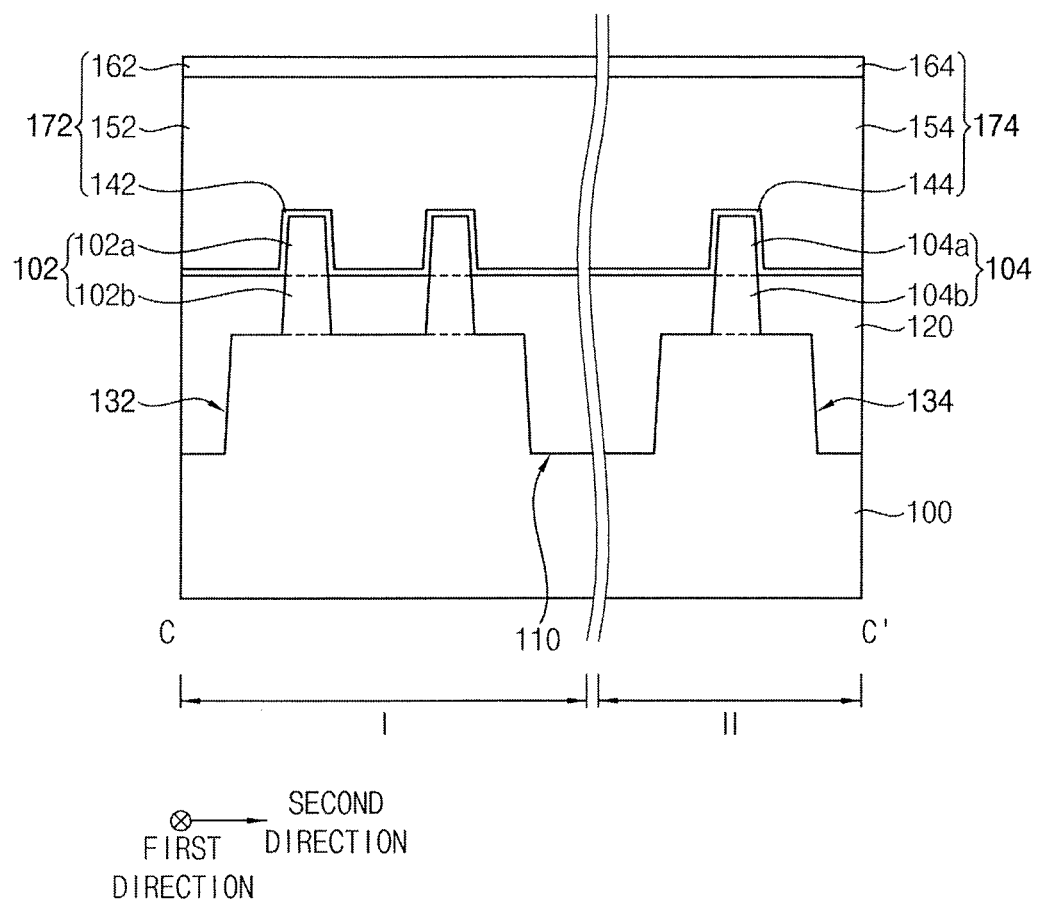

Referring to FIGS. 6 to 8, a first dummy gate structure 172 extending in the second direction may be formed on the first active fins 102 and the isolation pattern 120 on the first region I of the substrate 100, and a second dummy gate structure 174 extending in the second direction may be formed on the second active fins 104 and the isolation pattern 120 on the second region II of the substrate 100.

The first and second dummy gate structures 172 and 174 may be formed by sequentially forming a dummy gate insulation layer, a dummy gate electrode layer and a dummy gate mask layer on the first and second active fins 102 and 104 and the isolation pattern 120, patterning the dummy gate mask layer to form first and second dummy gate masks 162 and 164 on the first and second regions I and II, respectively, of the substrate 100, and sequentially etching the dummy gate electrode layer and the dummy gate insulation layer using the first and second dummy gate masks 162 and 164 as an etching mask.

Accordingly, the first dummy gate structure 172 including a first dummy gate insulation pattern 142, a first dummy gate electrode 152 and a first dummy gate mask 162 sequentially stacked may be formed on the first region I of the substrate 100, and the second dummy gate structure 174 including a second dummy gate insulation pattern 144, a second dummy gate electrode 154 and a second dummy gate mask 164 sequentially stacked may be formed on the second region II of the substrate 100.

The dummy gate insulation layer may include a nitride, e.g., silicon nitride, the dummy gate electrode layer may include, e.g., polysilicon, and the dummy gate mask layer may include a nitride, e.g., silicon nitride.

The dummy gate insulation layer may be formed by a chemical vapor deposition (CVD) process, an atomic layer deposition (ALD) process, or the like. In an example embodiment, the dummy gate insulation layer may be formed by a thermal oxidation process, and in this case, the dummy gate insulation layer may be formed only on an upper surface of each of the first and second active fins 102 and 104. The dummy gate electrode layer and the dummy gate mask layer may also be formed by a chemical vapor deposition (CVD) process, an atomic layer deposition (ALD) process, or the like.

Each of the first and second dummy gate structures 172 and 174 may extend in the second direction, and a plurality of first and second dummy gate structures 172 and 174 may be formed in the first direction. In an example embodiment, only one second dummy gate structure 174 may be formed on the second active fin 104, which may be formed on the at least one of the second active regions 134 in the second region II of the substrate 100. FIG. 6 illustrates that only one second dummy gate structure 174 is formed on each of the second active fins 104.

Figure 9:
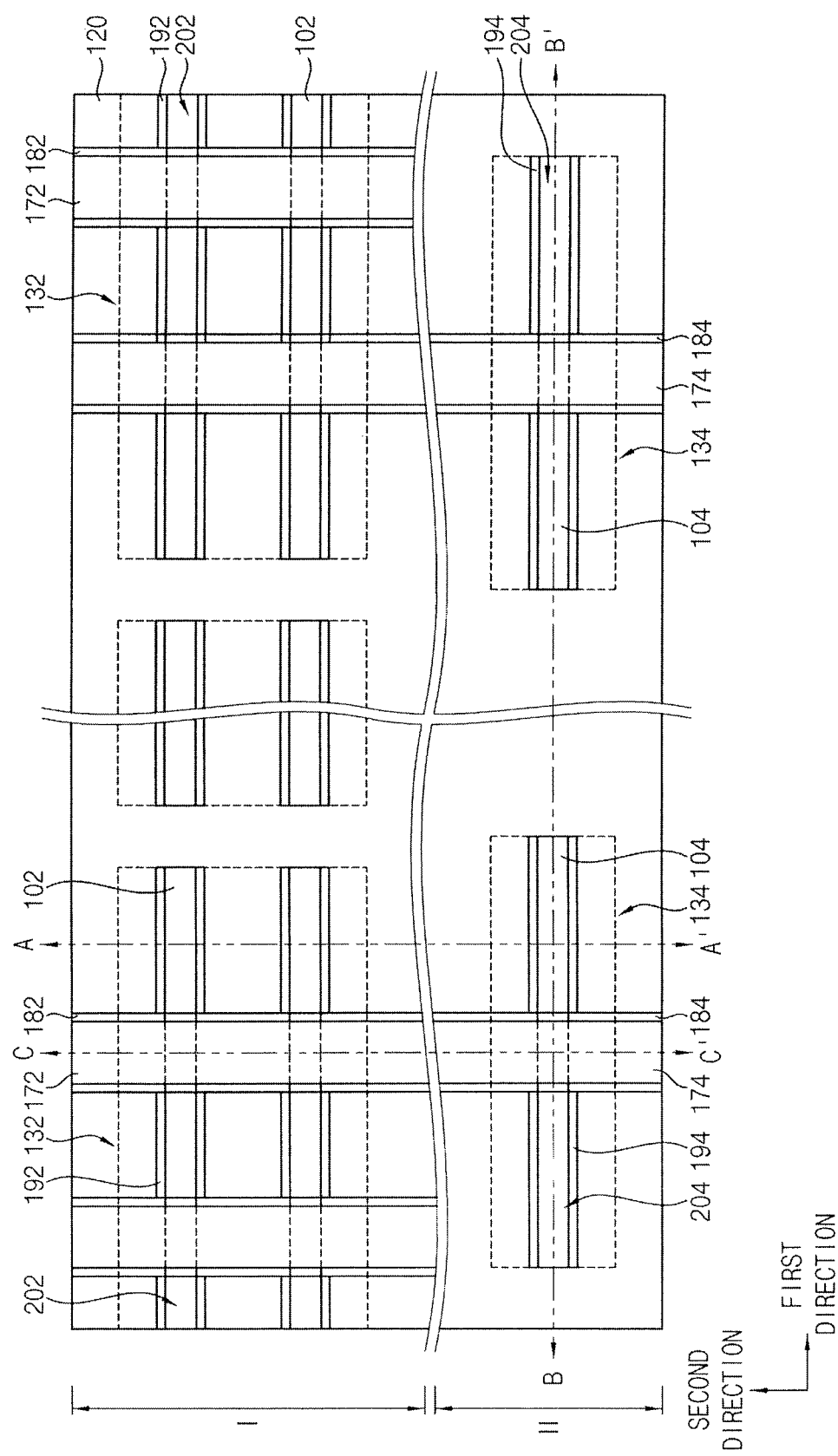
Figure 10:
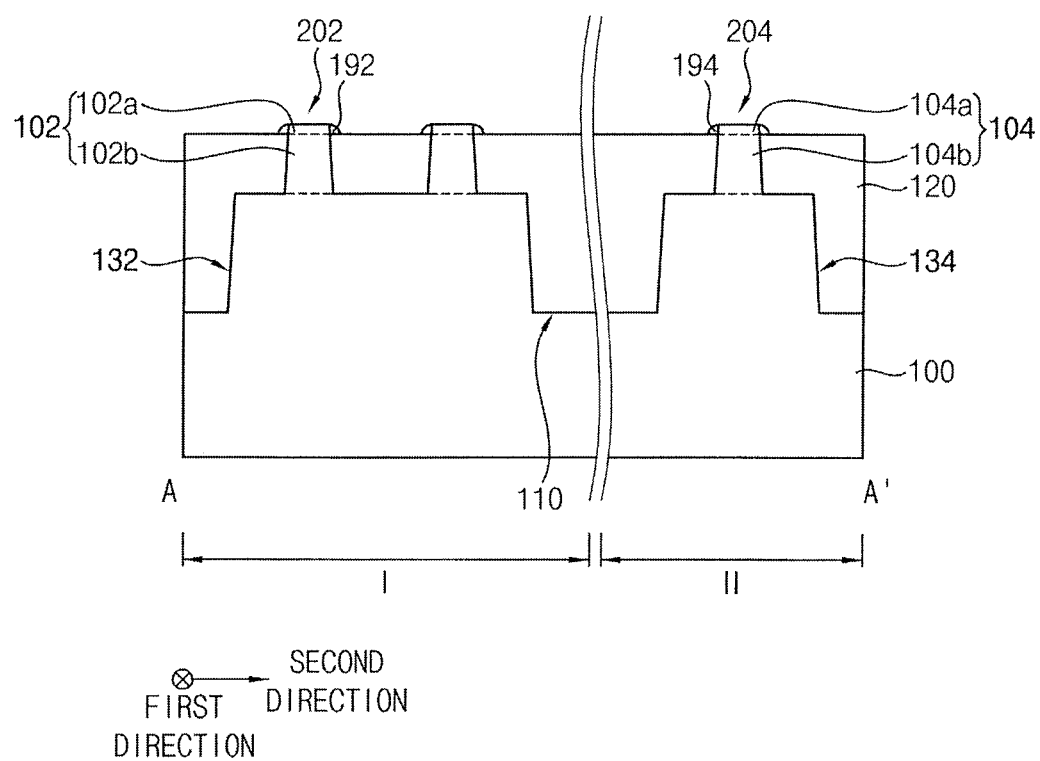
Figure 11:
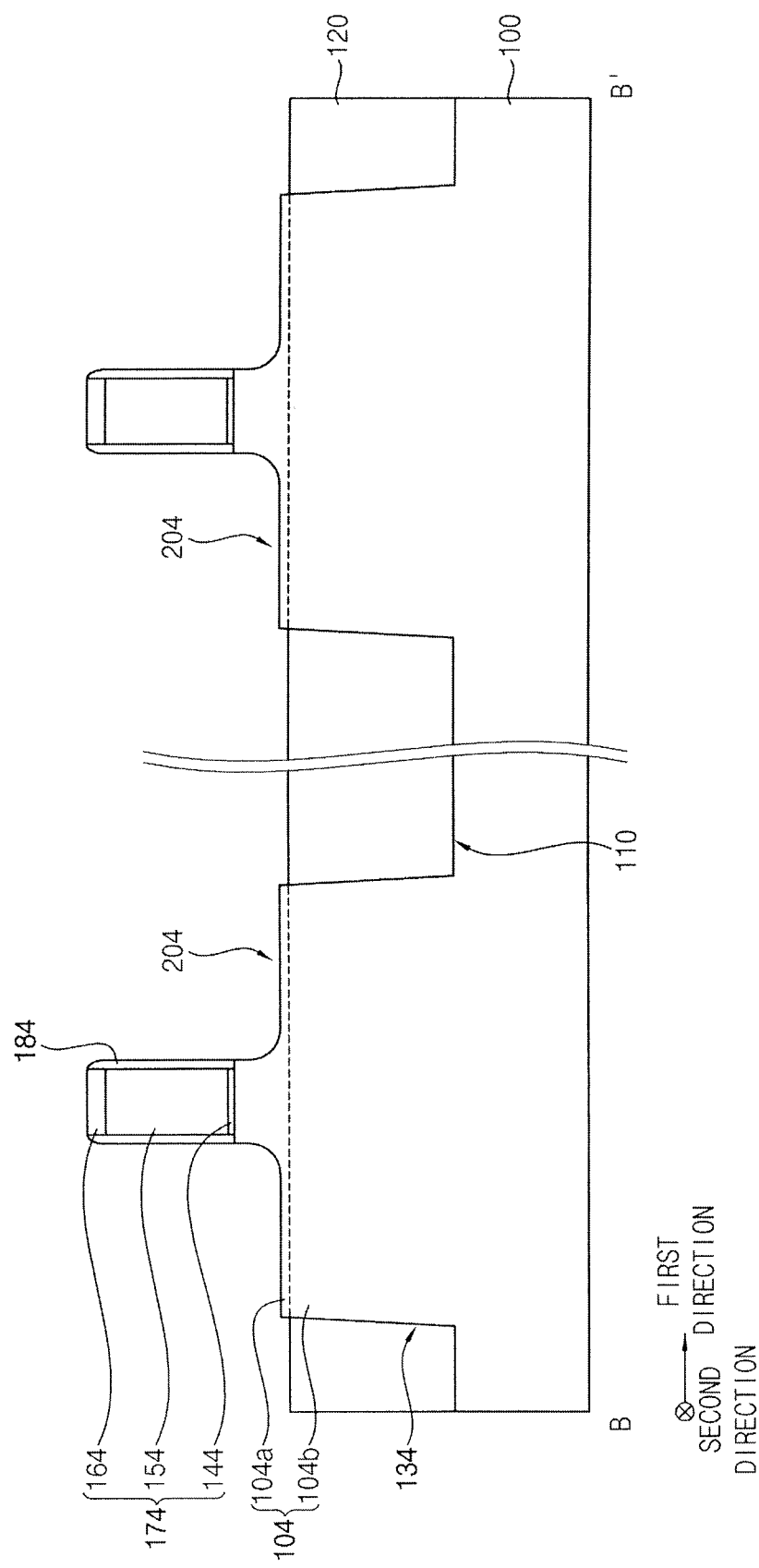

Referring to FIGS. 9 to 11, after forming a spacer layer on the first and second active fins 102 and 104 and the isolation pattern 120 to cover the first and second dummy gate structures 172 and 174, the space layer may be anisotropically etched to form first and second gate spacers 182 and 184 on opposite sidewalls in the first direction of the first and second dummy gate structures 172 and 174, respectively. First and second fin spacers 192 and 194 may be formed on opposite sidewalls in the second direction of the first and second upper active patterns 102a and 104a, respectively.

The spacer layer may include a nitride, e.g., silicon nitride. In an example embodiment, the spacer layer may have a structure containing a plurality of layers sequentially stacked, each of which may include, e.g., a nitride or an oxide.

Upper portions of the first and second active fins 102 and 104 at opposite sides of the first and second gate spacers 182 and 184, respectively, may be etched to form third and fourth recesses 202 and 204, respectively.

FIG. 11 illustrates that only portions of the first and second upper active patterns 102a and 104a of the first and second active fins 102 and 104, respectively, are etched to form third and fourth recesses 202 and 204, respectively, so that lower surfaces of the third and fourth recesses 202 and 204 are higher than upper surfaces of the first and second lower active patterns 102b and 104b, respectively. In another example embodiment, not only the first and second upper active patterns 102a and 104a, but also portions of the first and second lower active patterns 102b and 104b may be etched to form the third and fourth recesses 202 and 204, respectively, and thus lower surfaces of the third and fourth recesses 202 and 204 may be lower than portions of the first and second lower active patterns 102b and 104b, respectively, on which the third and fourth recesses 202 and 204 are not formed.

When the third and fourth recesses 202 and 204 are formed, the first and second fin spacers 192 and 194 on opposite sidewalls in the second direction of the first and second upper active patterns 102a and 104a, respectively, may be also partially removed or completely removed.

In an example embodiment, an etching process for forming the third and fourth recesses 202 and 204 may be performed in-situ with an etching process for forming the first and second gate spacers 182 and 184.

Figure 12:
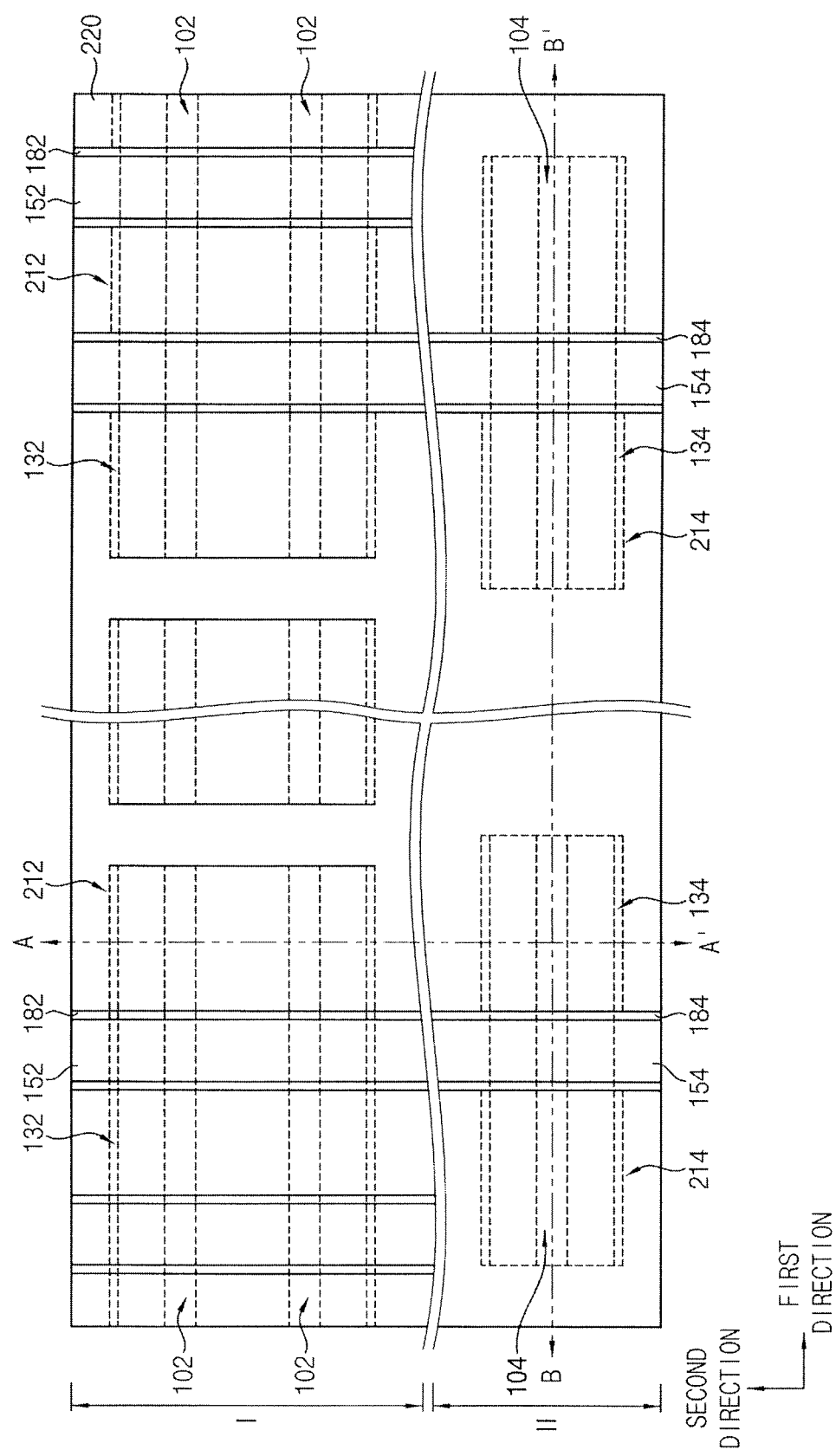
Figure 13:
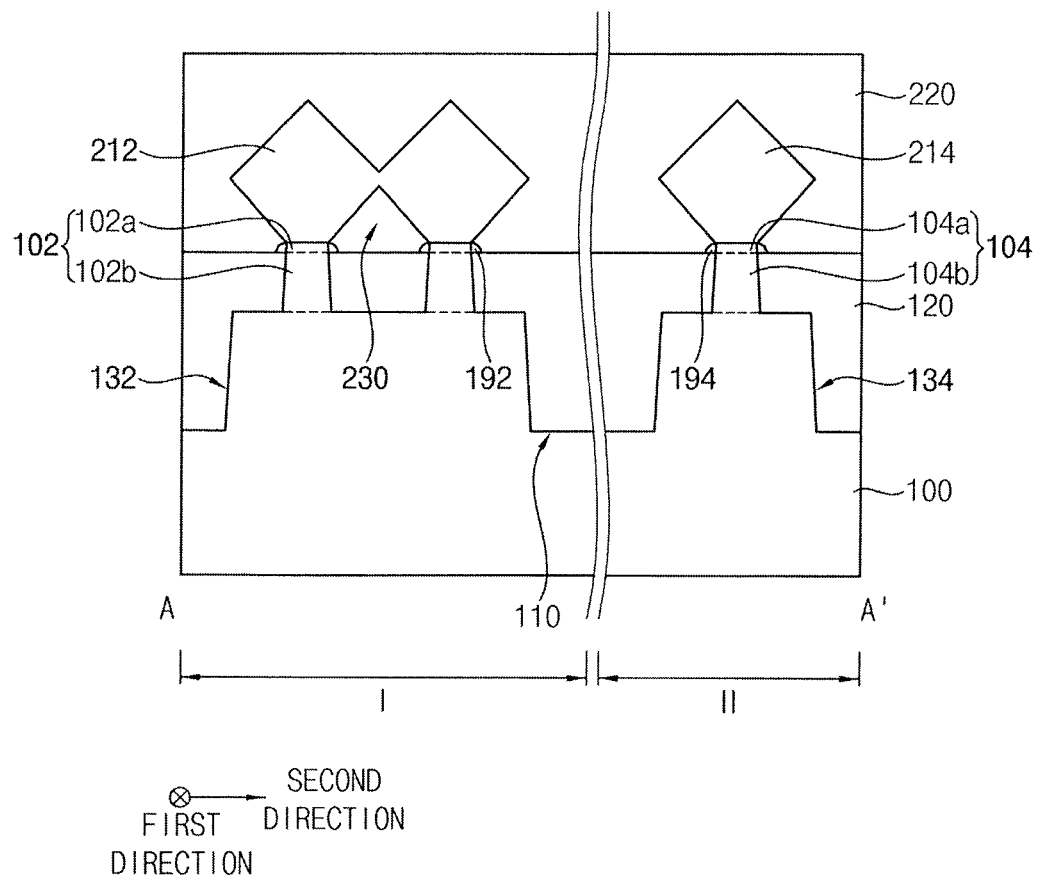
Figure 14:
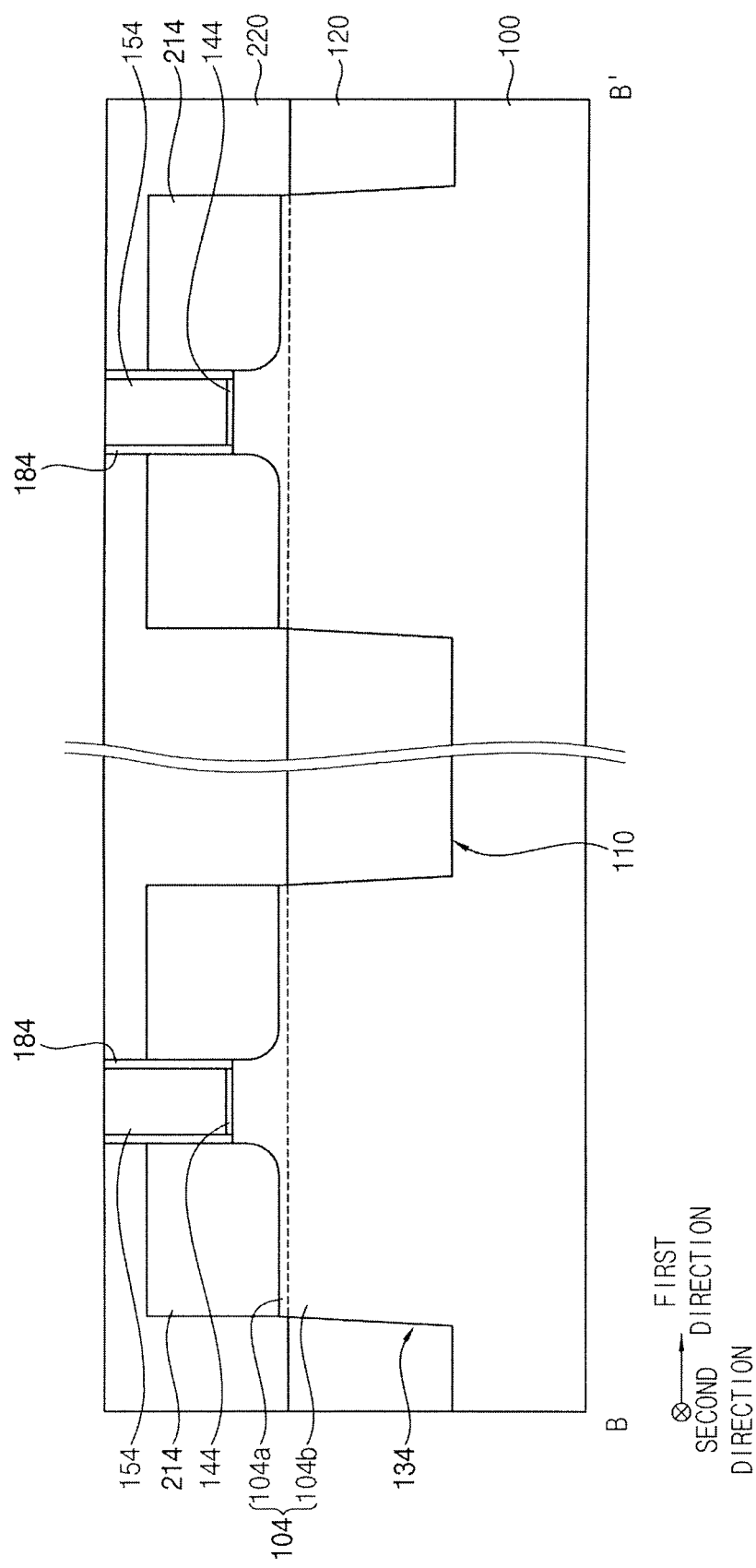

Referring to FIGS. 12 to 14, first and second source/drain layers 212 and 214 may be formed to fill the third and fourth recesses 202 and 204, respectively.

In an example embodiment, the first and second source/drain layers 212 and 214 may be formed by performing a selective epitaxial growth (SEG) process using upper surfaces of the first and second active fins 102 and 104 exposed by the third and fourth recesses 202 and 204, respectively, as a seed.

In an example embodiment, the SEG process may be performed using a silicon source gas, a germanium source gas, an etching gas, and a carrier gas, and thus a single crystalline silicon-germanium layer may be formed to serve as each of the first and second source/drain layers 212 and 214. In an example embodiment, the SEG process may be performed using a p-type impurity source gas, and thus a single crystalline silicon-germanium layer doped with p-type impurities may be formed to serve as each of the first and second source/drain layers 212 and 214.

In another implementation, the SEG process may be performed using a silicon source gas, a carbon source gas, an etching gas, and a carrier gas, and thus a single crystalline silicon carbide layer may be formed as each of the first and second source/drain layers 212 and 214. In an example embodiment, the SEG process may be performed using an n-type impurity source gas, and thus a single crystalline silicon carbide layer doped with n-type impurities may be formed to serve as each of the first and second source/drain layers 212 and 214. In an example embodiment, the SEG process may be performed using a silicon source gas, an etching gas, and a carrier gas, and thus a single crystalline silicon layer may be formed as each of the first and second source/drain layers 212 and 214. In this case, a single crystalline silicon layer doped with n-type impurities may be formed using an n-type impurity source gas together with the above-mentioned gases.

The first and second source/drain layers 212 and 214 may grow not only in a vertical direction but also in a horizontal direction to fill the third and fourth recesses 202 and 204, and may contact sidewalls of the first and second gate spacers 182 and 184, respectively. In an example embodiment, each of the first and second source/drain layers 212 and 214 may have a cross-section taken along the second direction having a pentagon-like shape.

In an example embodiment, when neighboring ones of the active fins 102 disposed in the second direction are close to each other, the first source/drain layers 212 growing on the neighboring ones of the active fins 102, respectively, may be merged with each other. FIG. 13 shows that two first source/drain layers 212 grown on two neighboring active fins 102, respectively, are merged with each other. In another example embodiment, more than two first source/drain layers 212 may be grown to be merged with each other.

A first insulating interlayer 220 covering the first and second dummy gate structures 172 and 174, the first and second gate spacers 182 and 184, the first and second fin spacers 192 and 194 and the first and second source/drain layers 212 and 214 may be formed on the first and second active fins 102 and 104 and the isolation pattern 120 to a sufficient height. The first insulating interlayer 220 may be planarized until upper surfaces of the first and second dummy gate electrodes 152 and 154 of the first and second dummy gate structures 172 and 174, respectively, are exposed. In the planarization process, the first and second dummy gate masks 162 and 164 may be also removed.

A space between the merged first source/drain layers 212 and the isolation pattern 120 may not be completely filled with the first insulating interlayer 220, and thus an air gap 230 may be formed therein.

The insulating interlayer 220 may include, e.g., a silicon oxide, e.g., tonen silazene (TOSZ). The planarization process may be performed by, e.g., a chemical mechanical polishing (CMP) process and/or an etch back process.

Figure 15:
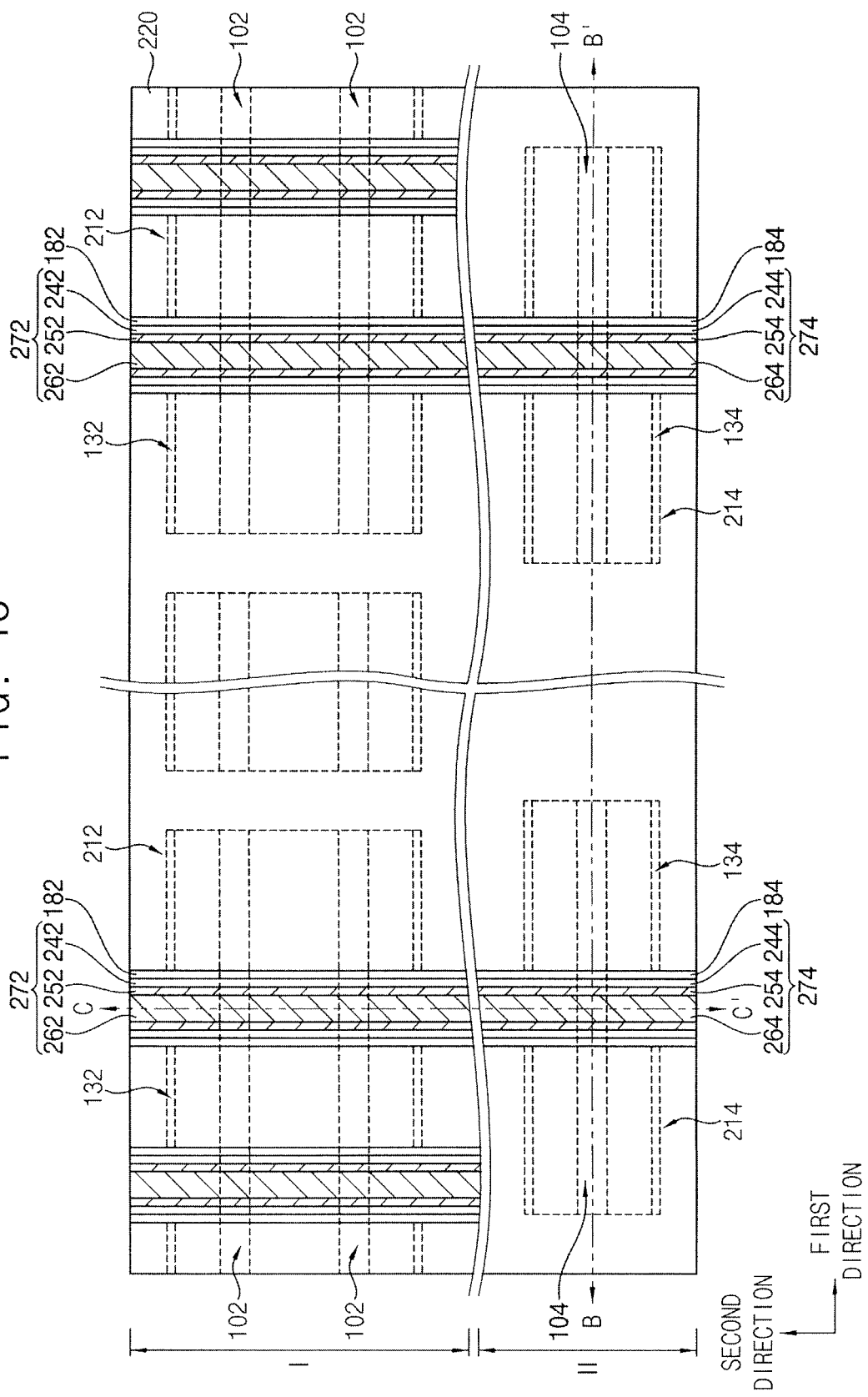
Figure 16:
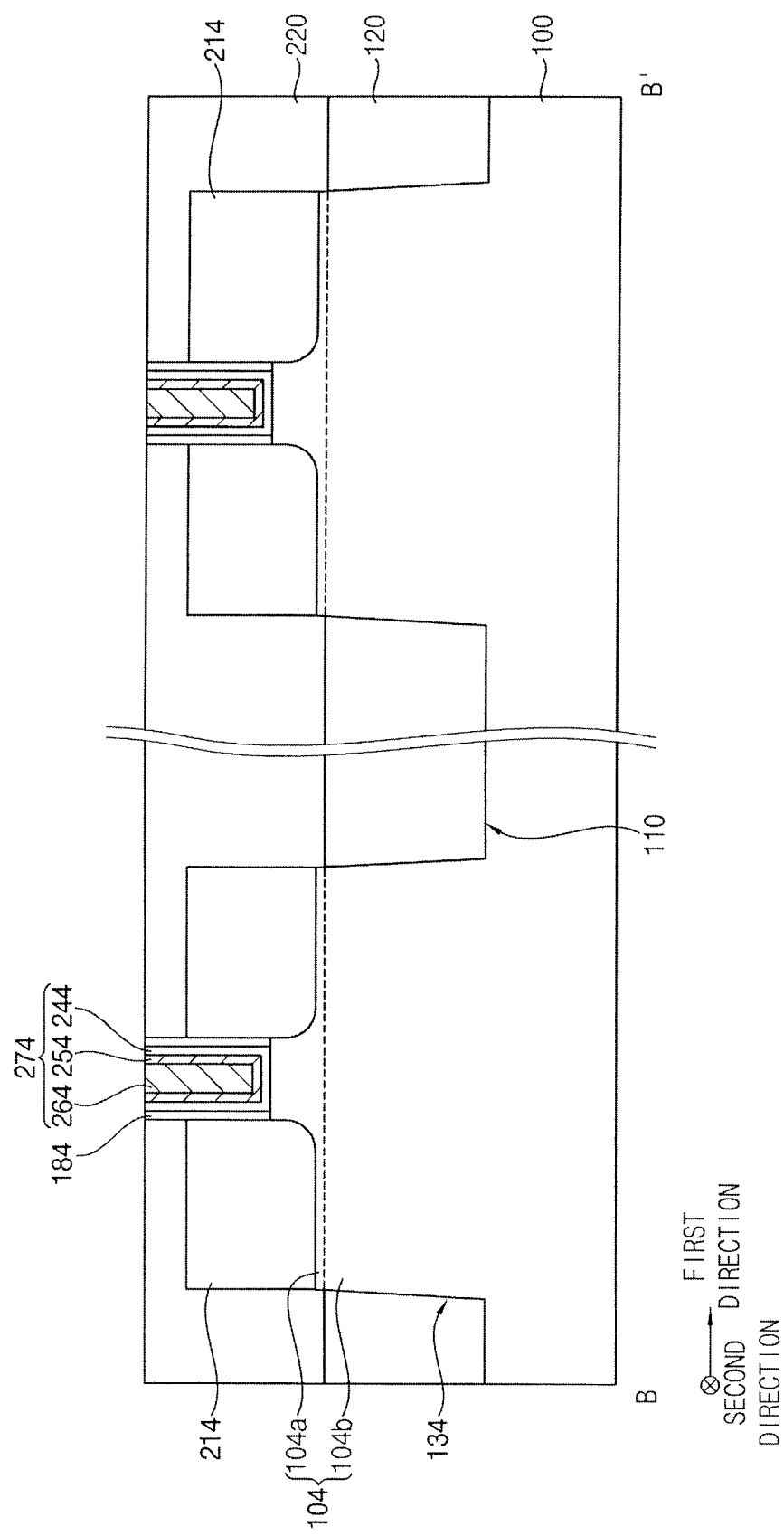
Figure 17:
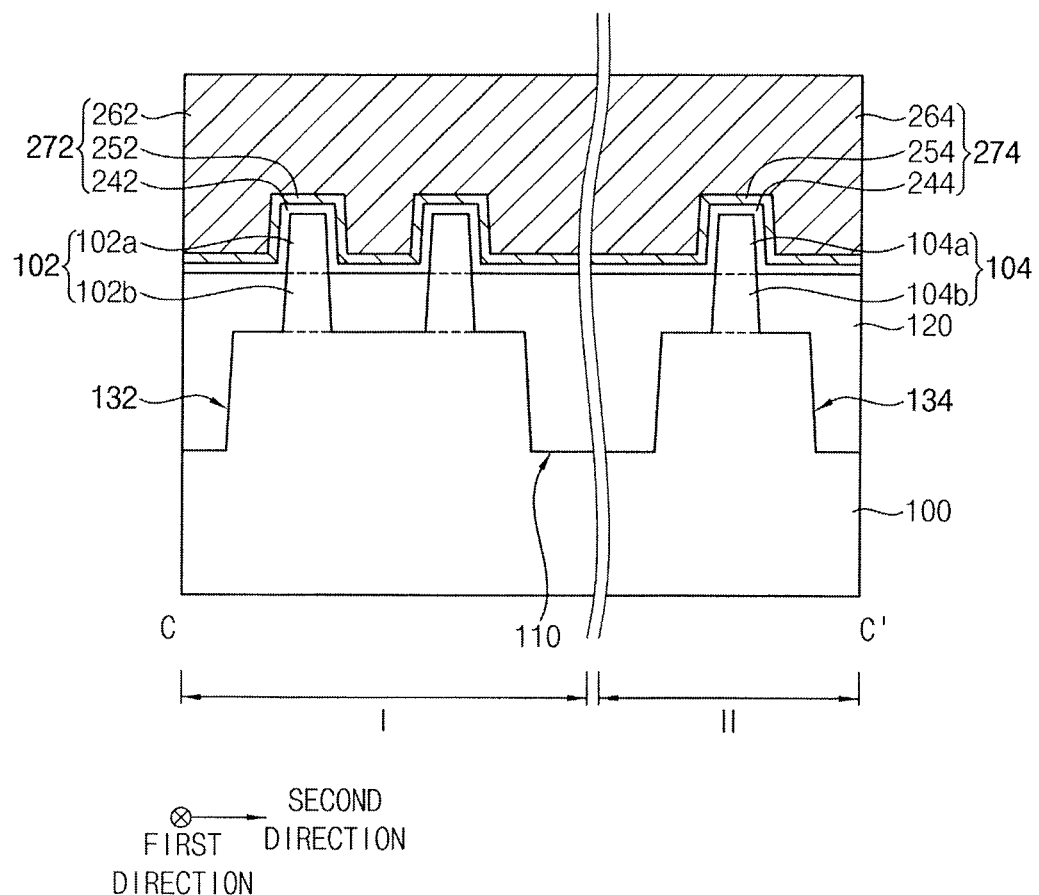

Referring to FIGS. 15 to 17, after removing the exposed first and second dummy gate electrodes 152 and 154 and the first and second dummy gate insulation patterns 142, 144 thereunder to form a first opening exposing an inner sidewall of the first gate spacer 182 and an upper surface of the first active fin 102 and a second opening exposing an inner sidewall of the second gate spacer 184 and an upper surface of the second active fin 104, first and second gate electrodes 272 and 274 may be formed to fill the first and second openings, respectively. In an example embodiment, the first and second dummy gate insulation patterns 142 and 144 may not be removed but remain.

A gate insulation layer and a work function control layer may be sequentially formed on the upper surfaces of the first and second active fins 102 and 104 exposed by the first and second openings, respectively, an upper surface of the isolation pattern 120, inner sidewalls of the first and second gate spacers 182 and 184, and the first insulating interlayer 220, and a gate electrode layer may be formed on the work function control layer to fill remaining portions of the first and second openings. The gate insulation layer may include, e.g., a metal oxide having a high dielectric constant, e.g., hafnium oxide (HfO$_2$), tantalum oxide (Ta$_2$O$_5$), zirconium oxide (ZrO$_2$), etc., the work function control layer may include, e.g., a metal nitride or a metal alloy, e.g., titanium nitride (TiN), titanium aluminum (TiAl), titanium aluminum nitride (TiAlN), tantalum nitride (TaN), tantalum aluminum nitride (TaAlN), etc., and the gate electrode layer may include, e.g., a metal having a low electrical resistance, e.g., aluminum (Al), copper (Cu), tantalum (Ta), etc., and a metal nitride thereof.

The gate electrode layer, the work function control layer and the gate insulation layer may be planarized until an upper surface of the first insulating interlayer 220 may be exposed. Thus, a first gate insulation pattern 242 and a first work function control pattern 252 sequentially stacked may be formed on the upper surface of the first active fin 102, the upper surface of the isolation pattern 120 and the inner sidewall of the first gate spacer 182, and a first gate electrode 262 may be formed on the first work function control pattern 252 to fill a remaining portion of the first opening. Also, a second gate insulation pattern 244 and a second work function control pattern 254 sequentially stacked may be formed on the upper surface of the second active fin 104, the upper surface of the isolation pattern 120 and the inner sidewall of the second gate spacer 184, and a second gate electrode 264 may be formed on the second work function control pattern 254 to fill a remaining portion of the second opening.

The first gate insulation pattern 242, the first work function control pattern 252 and the first gate electrode 262 sequentially stacked may form a first gate electrode structure 272, and the first gate electrode structure 272 together with the first source/drain layer 212 may form a first transistor. Also, the second gate insulation pattern 244, the second work function control pattern 254 and the second gate electrode 264 sequentially stacked may form a second gate electrode structure 274, and the second gate electrode structure 274 together with the second source/drain layer 214 may form a second transistor. The first and second transistors may serve as a PMOS transistor or an NMOS transistor according to the conductivity type of the first and second source/drain layers 212 and 214, respectively.

Figure 18:
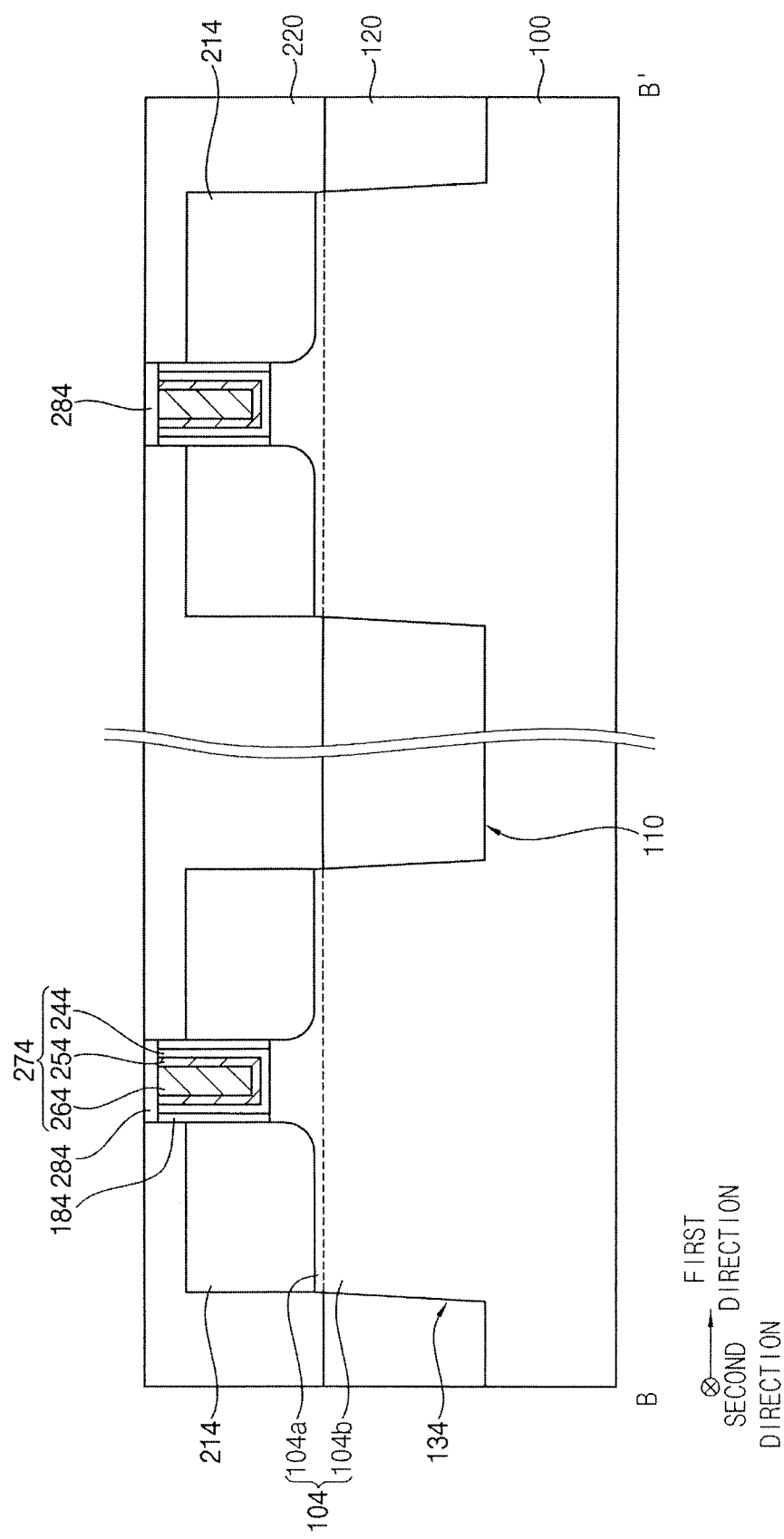

Referring to FIG. 18, after removing upper portions of the first and second gate electrode structures 272 and 274 and the first and second gate spacers 182 and 184 to form fifth and sixth recesses, respectively, a first capping pattern 282 (see FIGS. 19 and 23) and a second capping pattern 284 may be formed to fill the fifth and sixth recesses, respectively.

The first and second capping patterns 282 and 284 may be formed by forming a capping layer to fill the fifth and sixth recesses on the first and second gate electrode structures 272 and 274, the first and second gate spacers 182 and 184, and the first insulating interlayer 220, and planarizing the capping layer until an upper surface of the first insulating interlayer 220 is exposed.

In an example embodiment, the first and second capping patterns 282 and 284 may include a nitride, e.g., silicon nitride.

Hereinafter, the first gate electrode structure 272, the first gate spacer 182 covering a sidewall of the first gate electrode structure 272, and the first capping pattern 282 covering upper surfaces of the first gate electrode structure 272 and the first gate spacers 182 may be referred to as a first gate structure. Also, the second gate electrode structure 274, the second gate spacer 184 covering a sidewall of the second gate electrode structure 274, and the second capping pattern 284 covering upper surfaces of the second gate electrode structure 274 and the second gate spacers 184 may be referred to as a second gate structure.

Referring to FIGS. 19 to 23, a second insulating interlayer 290 may be formed on the first insulating interlayer 220 and the first and second capping patterns 282 and 284, third and fourth openings may be formed through the first and second insulating interlayers 220 and 290 to expose upper surfaces of the first and second source/drain layers 212 and 214, respectively, a first metal silicide pattern 302 and a first contact plug 312 may be sequentially formed on the first source/drain layer 212 exposed by the third opening, and a second metal silicide pattern 304 and a second contact plug 314 may be sequentially formed on the second source/drain layer 214 exposed by the fourth opening.

A first metal layer may be formed on the exposed upper surfaces of the first and second source/drain layers 212 and 214, sidewalls of the third and fourth openings and an upper surface of the second insulating interlayer 290, and a heat treatment process may be performed to form the first and second metal silicide patterns 302 and 304 on upper portions of the first and second source/drain layers 212 and 214, respectively. The first and second metal silicide patterns 302 and 304 may include, e.g., titanium silicide, cobalt silicide, nickel silicide, etc.

After removing unreacted portions of the first metal layer, a first barrier layer (not shown) may be formed on upper surfaces of the first and second metal silicide patterns 302 and 304, the sidewalls of the third and fourth openings, and the upper surface of the second insulating interlayer 290, a second metal layer may be formed on the first barrier layer to fill the third and fourth openings, and the second metal layer and the first barrier layer may be planarized until the upper surface of the second insulating interlayer 290 is exposed.

Accordingly, a first contact plug 312 filling the third opening and including a first barrier pattern and a second metal pattern may be formed on the first metal silicide pattern 302, and a second contact plug 312 filling the fourth opening and including a second barrier pattern and a third metal pattern may be formed on the second metal silicide pattern. The first and second barrier patterns may include, e.g., titanium nitride, tantalum nitride, and the second and third metal patterns may include a metal, e.g., tungsten, copper, aluminum.

Figure 21:
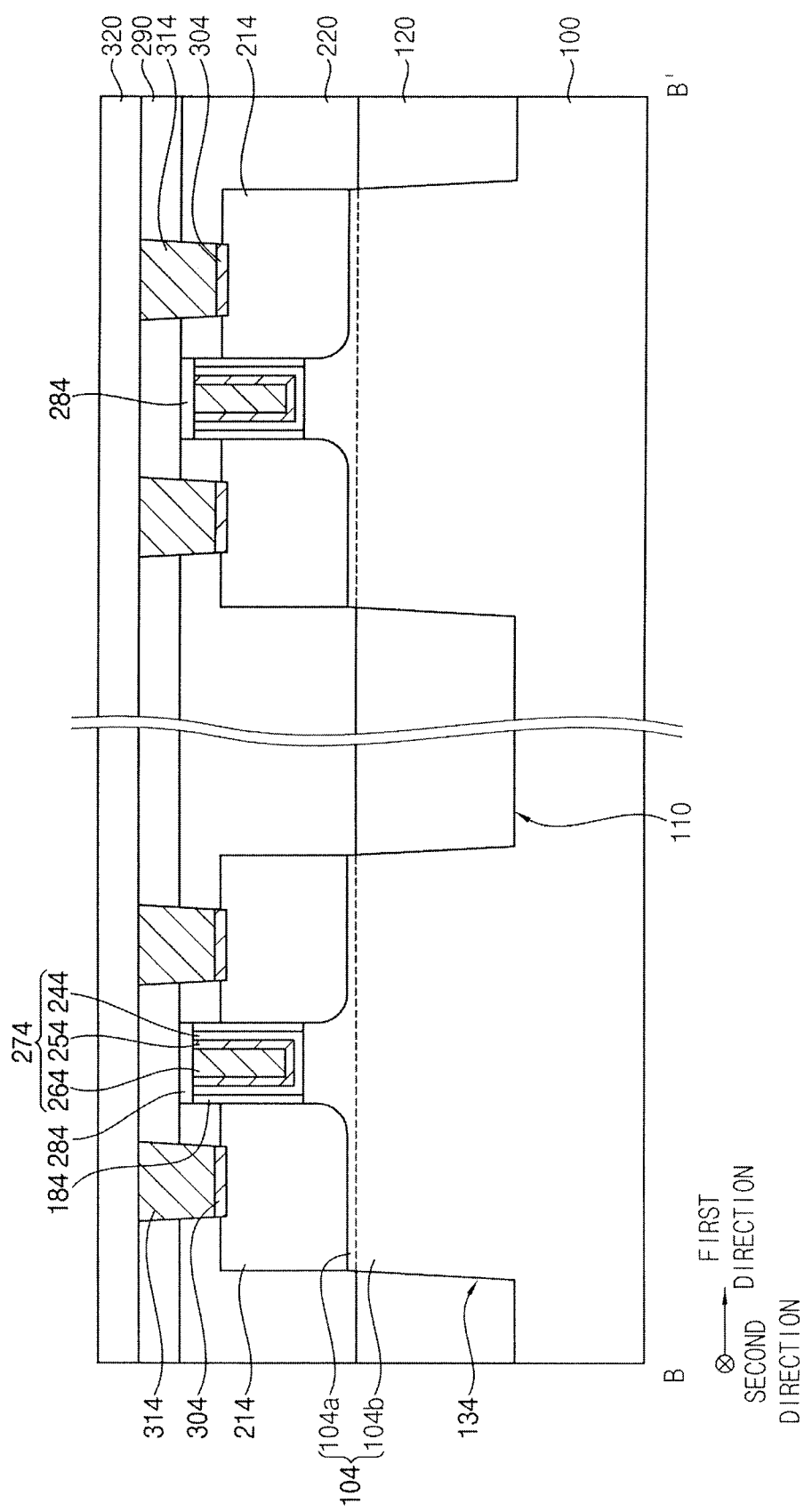
Figure 22:
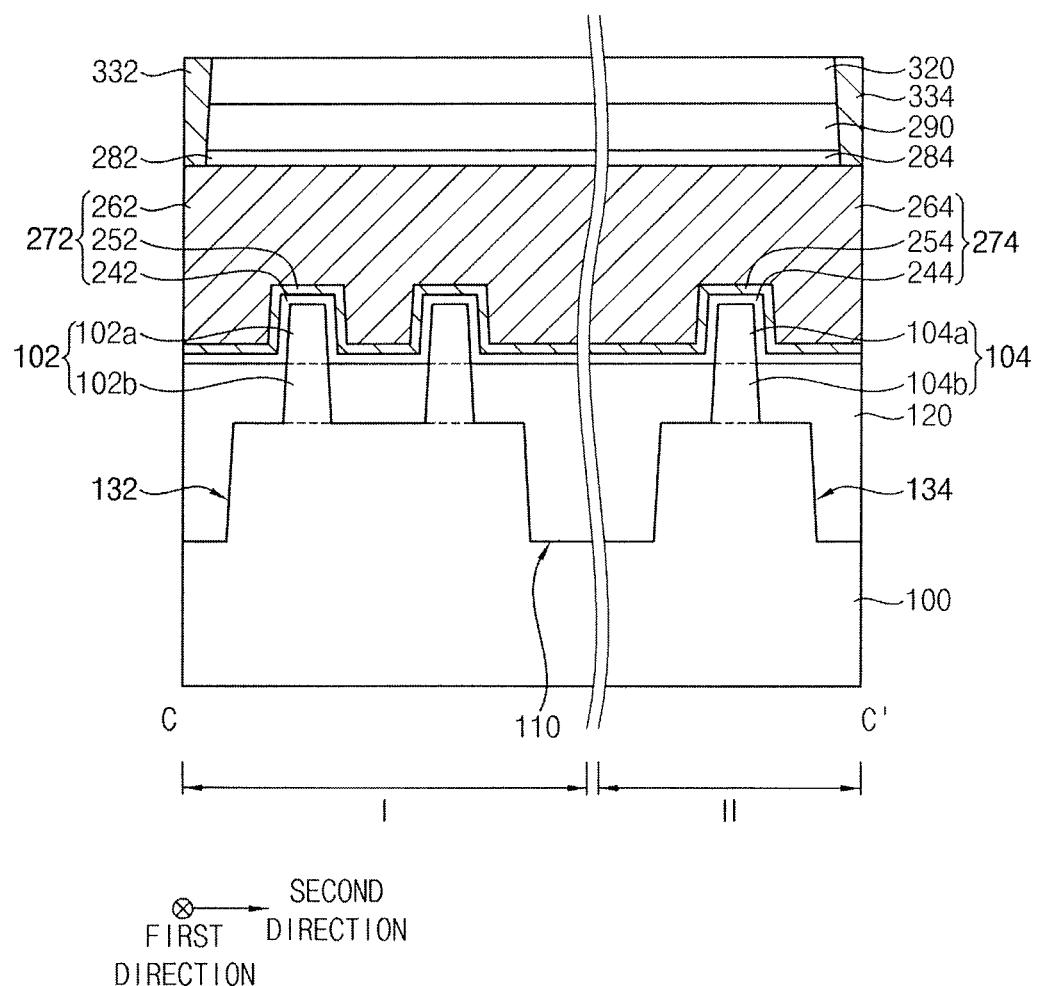

FIG. 21 illustrates that the first and second contact plugs 312 and 312 do not directly contact sidewalls of the first and second gate spacers 182 and 184. In another example embodiment, the first and second contact plugs 312 and 314 may be formed to be self-aligned with the sidewalls of the first and second gate spacers 182 and 184, respectively, and thus may contact the sidewalls of the first and second gate spacers 182 and 184, respectively.

A third insulating interlayer 320 may be formed on the second insulating interlayer 290 and the first and second contact plugs 312 and 314, fifth and sixth openings may be formed through the second and third insulating interlayers 290 and 320 and the first and second capping patterns 282 and 284, respectively, to expose upper surfaces of the first and second gate electrodes 262 and 264, respectively, and third and fourth contact plugs 332 and 334 may be formed on the first and second gate electrodes 262 and 264, respectively, exposed by the fifth and sixth openings.

Referring to FIGS. 24 to 27, a fourth insulating interlayer 340 may be formed on the third insulating interlayer 320 and third and fourth contact plugs 332 and 334, seventh and eighth openings may be formed through the third and fourth insulating interlayers 320 and 330 to expose upper surfaces of the first and second contact plugs 312 and 314, respectively, first and second vias 352 and 354 may be formed on the first and second contact plugs 312 and 314, respectively, exposed by the seventh and eighth openings. Also, after forming ninth and tenth openings through the fourth insulating interlayer 340 to expose upper surfaces of the third and fourth contact plugs 332 and 334, respectively, third and fourth vias 356 and 358 may be formed on the third and fourth contact plugs, respectively, exposed by the ninth and tenth openings.

A fifth insulating interlayer 360 may be formed on the fourth insulating interlayer 340 and the first to fourth vias 352, 354, 356 and 358, eleventh to fourteenth openings may be formed through the fifth insulating interlayer 360 to expose upper surfaces of the first to fourth vias 352, 354, 356 and 358, respectively, and first to fourth wirings 372, 374, 376 and 378 may be formed on the first to fourth vias 352, 354, 356 and 358, respectively, exposed by the eleventh to fourteenth openings. Each of the first to fourth wirings 372, 374, 376 and 378 may extend in the first direction or the second direction.

A sixth insulating interlayer 380 may be formed on the fifth insulating interlayer 360 and the first to fourth wirings 372, 374, 376 and 378, and a fifth via 392 and a fifth wiring 402 sequentially stacked and extending through the sixth insulating interlayer 380 to contact an upper surface of the first wiring 372, and a sixth via 394 and a sixth wiring 404 sequentially stacked and contacting an upper surface of the second wiring 374 may be formed. Each of the fifth and sixth wirings 402 and 404 may extend in the first direction or the second direction.

Although not shown, a seventh via and a seventh wiring sequentially stacked and extending through the sixth insulating interlayer 380 to contact an upper surface of the third wiring 376, and an eighth via and an eighth wiring sequentially stacked and contacting an upper surface of the fourth wiring 378 may be further formed.

In an example embodiment, by applying a test voltage to the sixth wiring 404, a leakage current of the second source/drain layer 214 electrically connected to the sixth wiring 404 through the sixth via 394, the second wiring 374, the second via 354, and the second contact plugs 314 may be detected. For example, by applying the test voltage to the sixth wiring 404 electrically connected to the second source/drain layer 214 on the at least one of the second active regions 134 including only one second active fin 104 thereon, the leakage current may be detected.

In an example embodiment, the first extension length L1 in the first direction of the second active fin 104 may have a value equal to or less than about 30 times the second width W2 in the second direction of the second active fin 104, and the first distance D1 between the second active region 134 including the second active fin 104 thereon and the neighboring second active region 134 may have a value equal to or more than about 30 times the second width W2 in the second direction of the second active fin 104. Accordingly, the density of the second active fin 104 in a given area is relatively very low, and thus the second active fin 104 may be subjected to a relatively great stress from other layer structures covering the second active fin 104. As a result, the leakage current of the second source/drain layer 214 on the second active fin 104 may have a relatively large value, and the measurement may be easily performed.

By way of a test element group (TEG) structure that includes the second active fin 104 on the second region II of the substrate 100, a transistor (including the second gate structure and the second source/drain layer 214 on the second active fin 104, and the second contact plug 314), the second wiring 374, the sixth via 394, and the sixth wiring 404 connected to the transistor, a leakage current of the first source/drain layer 212 in the first region I of the substrate 100 may be determined.

According to the result of the leakage current measurement, a determination can be made early in the process as to whether or subsequent processes are to be performed. For example, when the leakage current exceeding a given standard is measured, fabrication may be terminated, whereas, when a leakage current below the given standard is measured, the subsequent processes may be further performed to complete the fabrication of the semiconductor device.

After completing the fabrication of the semiconductor device, a plurality of semiconductor chips may be manufactured by removing the second region II of the substrate 100, e.g., in a dicing operation, and the TEG structure on the second region II of the substrate 100 may be also removed.

Figure 28:
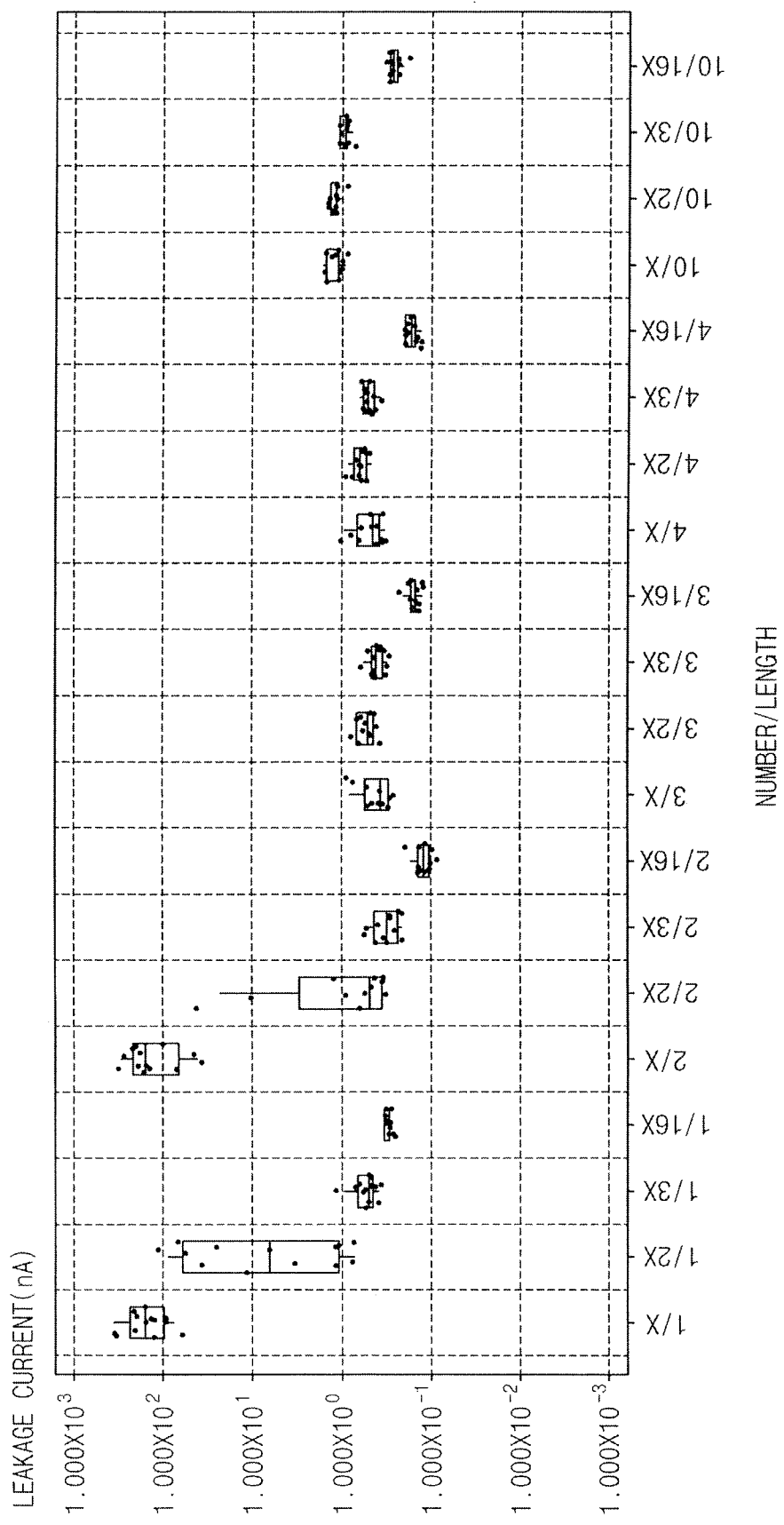
FIG. 28 illustrates a graph of a relationship of the length of active fin and the number of the active fins included in an active region and a leakage current of a source/drain layer formed on the active fin.
Figure 29:
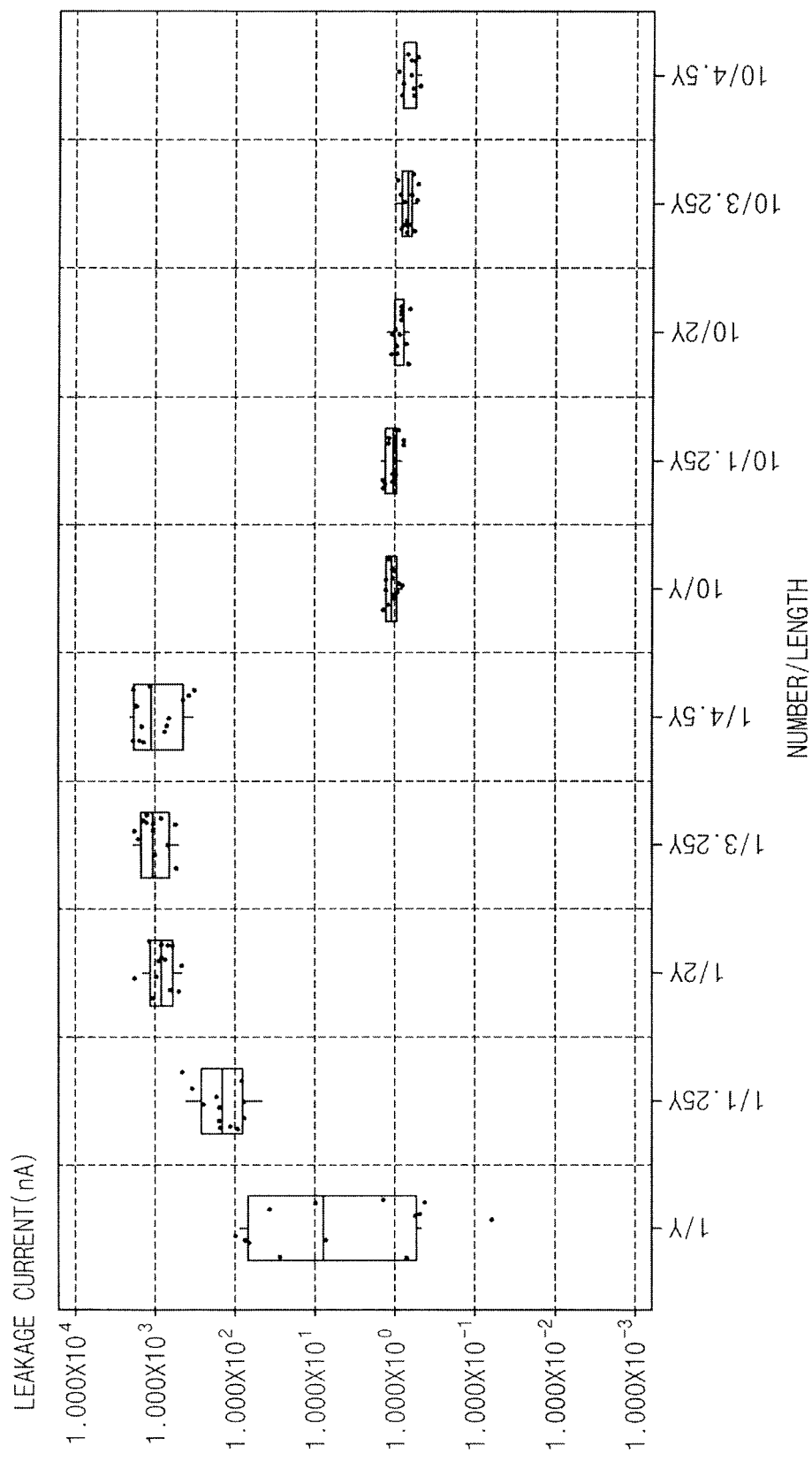
FIG. 29 illustrates a graph of a relationship of the distance between active regions including active fins and a leakage current of a source/drain layer formed on the active fin.

FIG. 28 is a graph illustrating the relationship of lengths and number of active fins included in an active region and a leakage current of source/drain layers on the active fins. FIG. 29 is a graph illustrating the relationship of a distance between active regions including active fins and a leakage current of source/drain layers on the active fins.

Referring to FIG. 28, it can be seen that the leakage current of the source/drain layers has a very small value as the number of active fins in an active region increases to, e.g., three or more. Also, when the number of the active fins in the active region is small, e.g., one or two, it may be seen that the leakage current of the source/drain layers has a very small value as an extension length of the active fin increases to, e.g., 3X or more. Accordingly, when one active region includes very small number of active fin, e.g., one or two, and an extension length of each of the active fins has a small value, e.g., X or 2X, the leakage current of the source/drain layers on the active fins may be large. In an example embodiment, the X may have a value of about 15 times a width of the active fin, and thus when the extension length has a value equal to or less than about 30 times the width of the active fin, a high leakage current may occur, easing detection of the leakage current.

Referring to FIG. 29, it can be seen that when one active region includes large number of active fins, e.g., 10 active fins thereon, a leakage current of source/drain layers may have a very small value regardless of the distance between the active fins. Further, it can be seen that active regions each including only one active fin thereon have a large leakage current value as the distance therebetween increases to, e.g., 1.25Y or more. In an example embodiment, the Y may have a value of 24 times the width of the active fin, and thus when the distance between the active fins has a value equal to or more than about 30 times the width of the active fin, a high leakage current may occur, easing detection of the leakage current.

Referring to FIGS. 28 and 29, it can be seen that the lower the density of the active fins included in the given region is, the greater may be the leakage current of the source/drain layers on the active fins (without being bound by theory, this may be due to increased stress received from layer structures surrounding the active fin). Accordingly, a relatively high leakage current may occur around an active fin that may be formed at a relatively low density in the chip region, and a TEG structure on the scribe lane region, which may be used for measuring the leakage current, may have a structure generating a relatively high leakage current, so that the leakage current may be efficiently detected.

Figure 30:
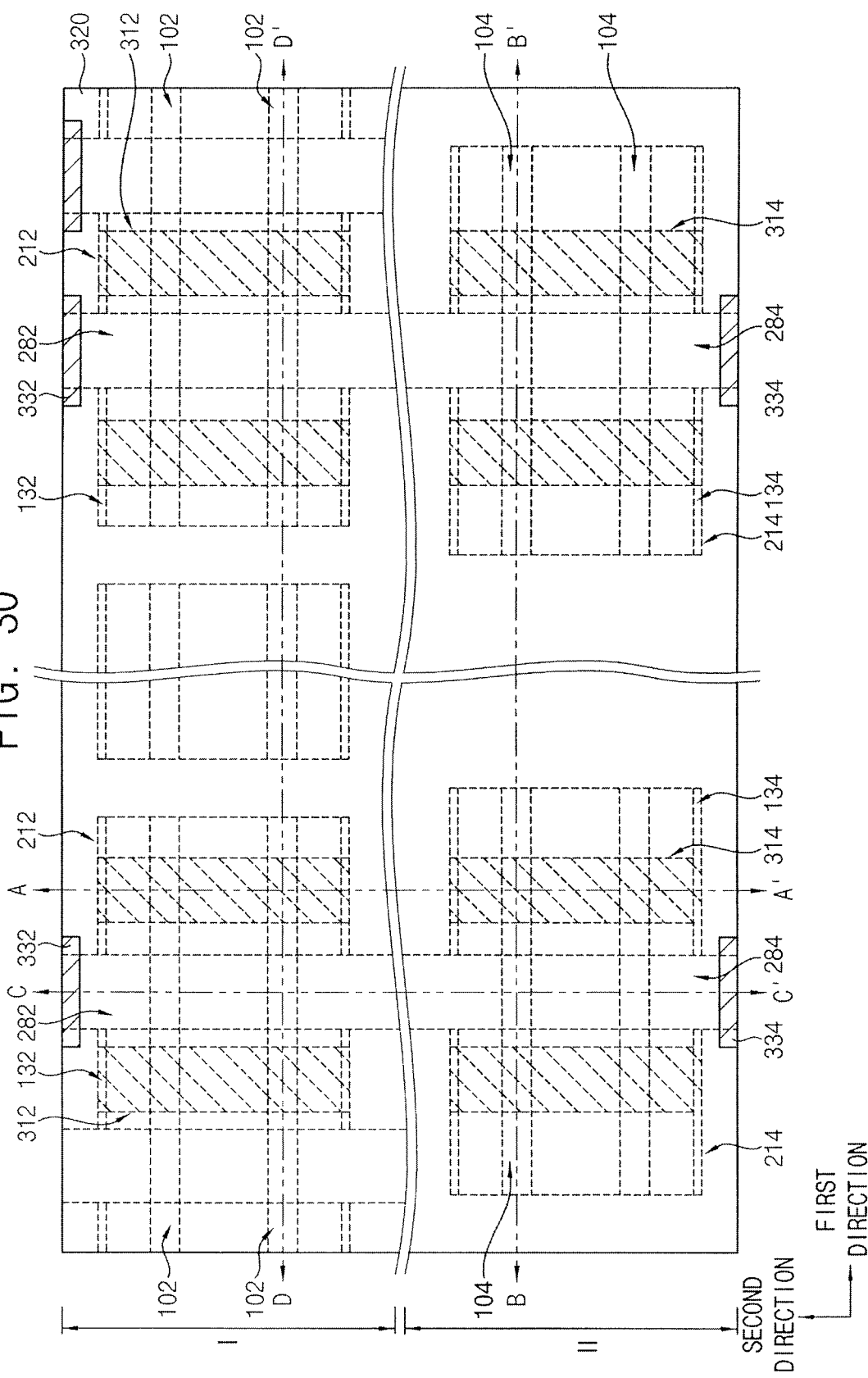

FIGS. 30 to 32 are plan views illustrating semiconductor devices in accordance with an example embodiment. Specifically. FIGS. 30 to 32 are plan views corresponding to FIG. 19.

Figure 19:
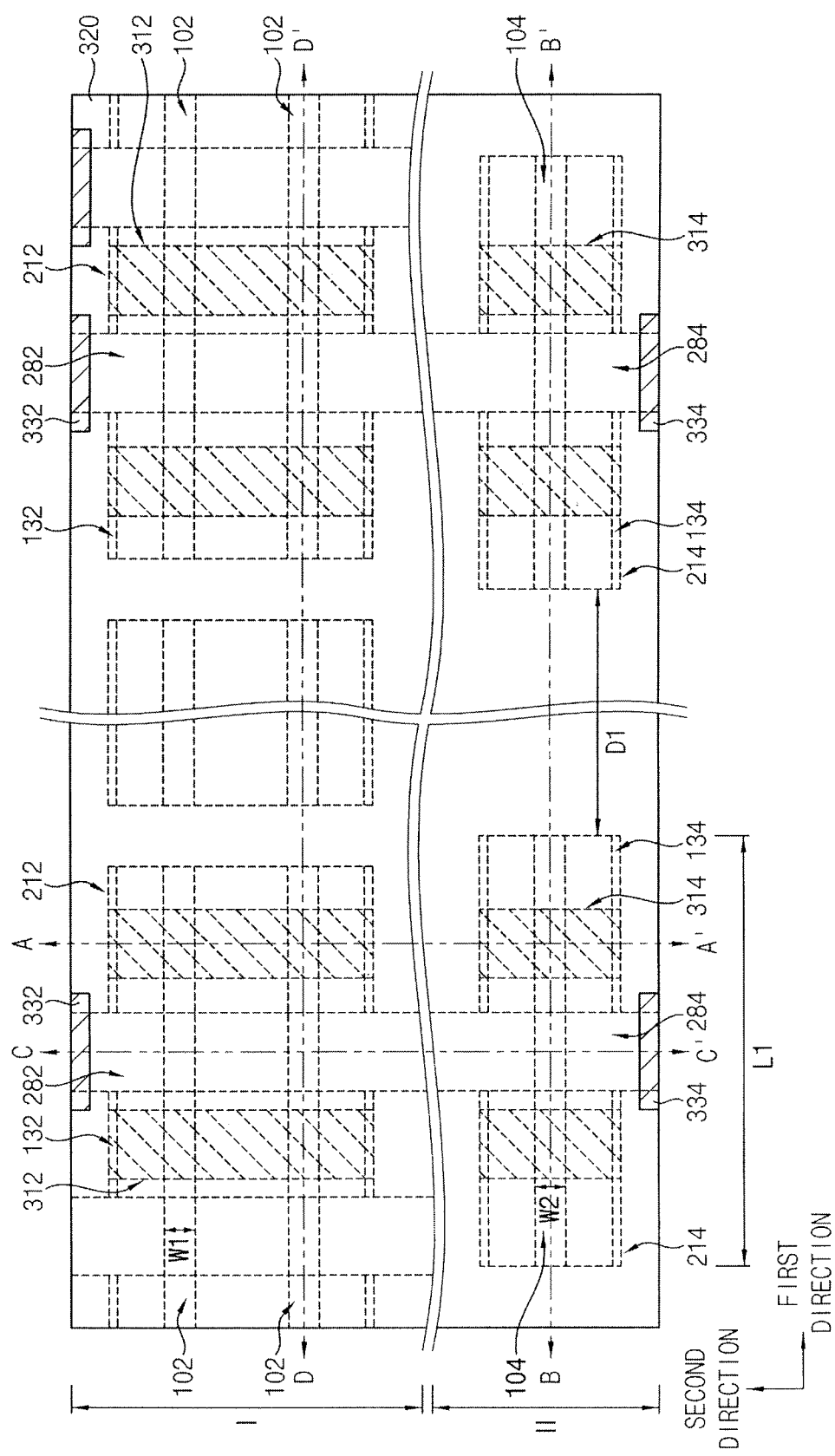
Figure 20:
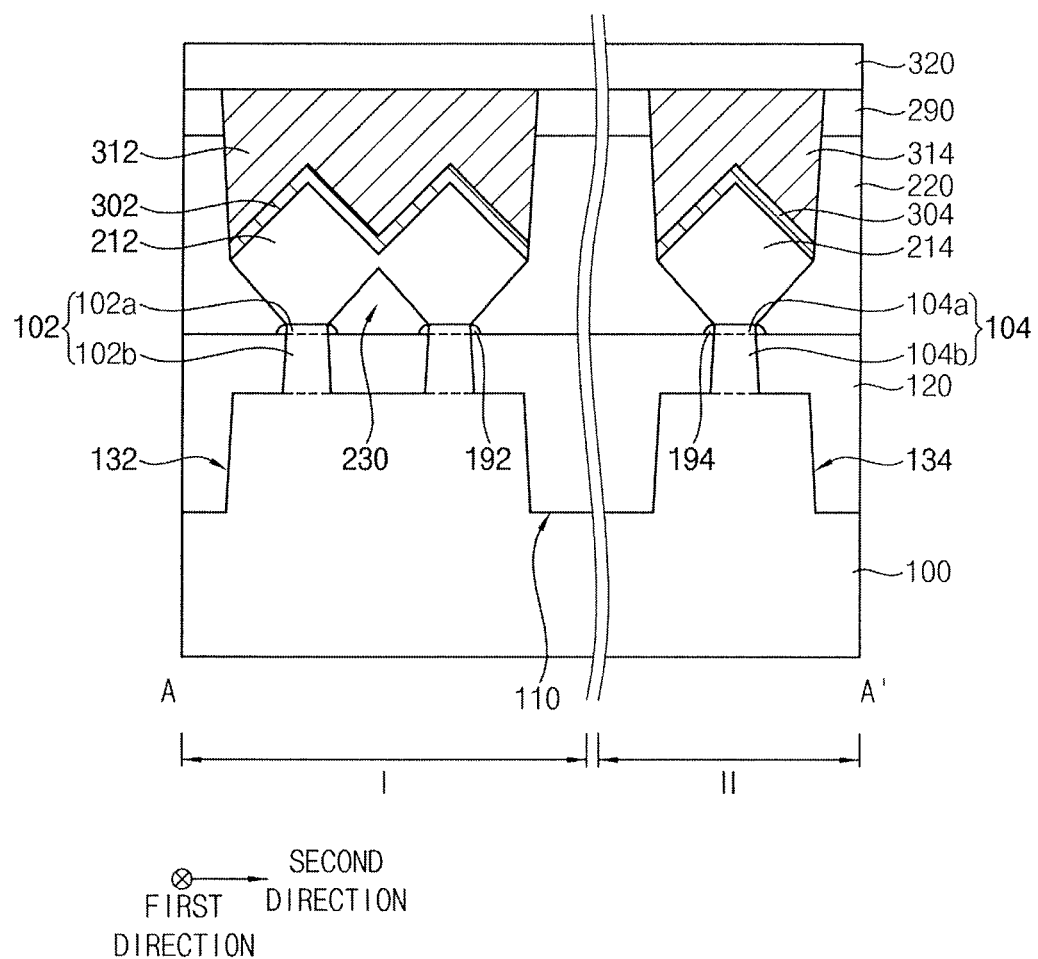

These semiconductor devices may be substantially the same as or similar to the semiconductor device illustrated in FIG. 19, except for the number of second active fins included in one second active region, the number of second gate structures on the second active fin, and the distance between the second active regions. Accordingly, like reference numerals refer to like elements, and detailed descriptions thereof are omitted herein.

Referring to FIG. 30, two second active fins 104 spaced apart from each other may be formed on one second active region 134. As described above, when one or two second active fins 104 are included on one second active region 134, a high leakage current may occur, which may ease detection thereof.

Referring to FIG. 31, two second gate structures spaced apart from each other may be formed on one second active region 134. Accordingly, the second active fin 104 on the second active region 134 may have a second extension length L2 in the first direction. However, the second extension length L2 may also have a value equal to or less than about 30 times the second width W2 in the second direction of the second active fin 104, and thus a high leakage current may occur.

Referring to FIG. 32, the second active regions 134 each including one second active fin 104 thereon and arranged in the first direction may be spaced apart from each other by a second distance D2. The second distance D2 may have a value equal to or less than about 30 times the second width W2 in the second direction of the second active fin 104, and thus a high leakage current may occur.

The semiconductor device described above may be used in various types of memory devices and systems including, e.g., finFETs, gate-all-around (GAA) transistors, multi-channel transistors (MBCFets), and the like.

By way of summation and review, a test element group (TEG) pattern may be used in a process of detecting failure of a semiconductor chip, e.g., in an in-FAB analysis. However, the cause of a leakage current between a source and a drain of a transistor included in the semiconductor chip may vary. Realizing a TEG pattern capable of detecting a leakage current of a transistor having a 3-D structure of a minute size may present significant challenges.

As described above, embodiments relate to a method of detecting a leakage current between a source and a drain of a transistor. In a method of detecting failure of a semiconductor device according to an example embodiment, a TEG structure on the scribe lane region may be used for measuring a leakage current, The TEG structure may include active fins of low density, and thus may have a structure generating a relatively high leakage current, so that the leakage current may be efficiently detected.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of detecting failure of a semiconductor device, the method comprising:
    forming first and second active fins on first and second regions, respectively, of a substrate;
    forming first and second gate structures on the first and second active fins, respectively;
    forming first source/drain layers on respective portions of the first active fin at opposite sides of the first gate structure, and forming second source/drain layers on respective portions of the second active fins at opposite sides of the second gate structure;
    forming first and second wirings to be electrically connected to the first and second source/drain layers, respectively; and
    detecting a leakage current between the second source/drain layers by applying a voltage to the second wiring,
    wherein the first and second active fins are formed on first and second active regions, respectively, in the first and second regions of the substrate, the first and second active regions having upper surfaces higher than those of other portions in the first and second regions, respectively, of the substrate, and
    wherein only one or two second active fins are formed on the second active region.

2. The method as claimed in claim 1, wherein only one or two second gate structures are formed on the second active fin.

3. The method as claimed in claim 2, wherein one or a plurality of first active fin is formed on the first active fin.

4. The method as claimed in claim 1, wherein one or a plurality of first active fins is formed on the first active region.

5. The method as claimed in claim 1, wherein each of the first and second active fins extends in a first direction, and each of the first and second gate structures extends in a second direction intersecting the first direction.

6. The method as claimed in claim 5, wherein:
    a plurality of second active regions is formed in the first direction, and
    a distance between neighboring ones of the plurality of second active regions is equal to or more than about 30 times a width in the second direction of the second active fin.

7. The method as claimed in claim 5, wherein an extension length in the first direction of the second active fin is equal to or less than about 30 times a width in the second direction of the second active fin.

8. The method as claimed in claim 1, wherein the first region is a chip region, and the second region is a scribe lane region to be separated from the first region in a dicing operation.

9. The method as claimed in claim 1, wherein forming the first and second active fins includes:
    forming the first and second active fins by removing an upper portion of the substrate to form a first recess;
    forming a second recess deeper than the first recess by removing portions of the first and second active fins and a portion of the substrate thereunder; and
    forming an isolation pattern on the substrate to fill the second recess and a lower portion of the first recess,
    wherein the first and second active regions are defined by the second recess.

10. The method as claimed in claim 1, wherein forming the first and second gate structures on the first and second active fins, respectively, includes:
    forming first and second dummy gate structures on the first and second active fins, respectively;
    forming an insulating interlayer on the substrate to cover sidewalls of the first and second dummy gate structures;
    removing the first and second dummy gate structures to form first and second openings, respectively; and
    forming the first and second gate structures in the first and second openings, respectively.

11. The method as claimed in claim 1, wherein forming the first and second source/drain layers includes:
    partially removing the first and second active fins to form third and fourth recesses, respectively; and
    performing a selective epitaxial growth process to form the first and second source/drain layers filling the third and fourth recesses, respectively.

12. The method as claimed in claim 2, further comprising:
    forming first and second contact plugs on the first and second source/drain layers, respectively;
    forming first and second vias on the first and second contact plugs, respectively;
    forming third and fourth wirings on the first and second vias, respectively; and
    forming third and fourth vias on the third and fourth wirings, respectively,
    wherein the first and second wirings are formed on the third and fourth vias, respectively.

13. A method of detecting failure of a semiconductor device, the method comprising:
    forming an active fin on an active region of a substrate, the active fin extending in a first direction;
    forming a gate structure on the active fin, the gate structure extending in a second direction intersecting the first direction;
    forming source/drain layers on respective portions of the active fins at opposite sides of the gate structure;
    forming a wiring to be electrically connected to the source/drain layers; and
    applying a voltage to measure a leakage current between the source/drain layers,
    wherein only one or two active fins are formed on the active region, and
    wherein only one or two gate structures are formed on the active fin.

14. The method as claimed in claim 13, wherein a plurality of active regions is formed to be spaced apart from each other in the first direction or the second direction.

15. The method as claimed in claim 14, wherein a distance between neighboring ones of the plurality of active regions is equal to or more than about 30 times a width in the second direction of the active fin.

16. The method as claimed in claim 13, wherein an extension length in the first direction of the active fin is equal to or less than about 30 times a width in the second direction of the active fin.

17. The method as claimed in claim 13, wherein the active region of the substrate is formed in a scribe lane region of the substrate.

18. The method as claimed in claim 13, wherein the active region of the substrate has an upper surface higher than those of other portions of the substrate.

19. A method of detecting failure of a semiconductor device, the method comprising:
    removing an upper portion of a substrate in a second direction to form active fins that extend in a first direction intersecting the second direction;
    removing one or more of the active fins and a portion of the substrate to form active regions that are spaced apart from each other in the first direction or the second direction, each of the active regions including ones of the active fins thereon, and at least one first active region of the active regions including only one or two active fins thereon;
    forming a gate structure on the active fins, the gate structure extending in the second direction;
    forming source/drain layers on respective portions of the active fins at opposite sides of the gate structure;
    forming wirings to be electrically connected to the source/drain layers, respectively; and
    applying a voltage to one or ones of the wirings electrically connected to the source/drain layers on the active fins on the at least one first active region to measure a leakage current between the source/drain layers.

20. The method as claimed in claim 19, wherein only one or two gate structures are formed on the active fins on the at least one first active region.

* * * * *